US012592708B2

(12) United States Patent
Lee et al.

(10) Patent No.: US 12,592,708 B2
(45) Date of Patent: Mar. 31, 2026

(54) SAR ANALOG-TO-DIGITAL CONVERTER WITH HIGH-ORDER NOISE-SHAPING CHARACTERISTICS

(71) Applicant: Daegu Gyeongbuk Institute of Science and Technology, Daegu (KR)

(72) Inventors: Jung Hyup Lee, Daegu (KR); Geun Ha Kim, Jinju-si (KR); Jae Eun Jang, Daegu (KR)

(73) Assignee: Daegu Gyeongbuk Institute of Science and Technology, Daegu (KR)

( * ) Notice: Subject to any disclaimer, the term of this patent is extended or adjusted under 35 U.S.C. 154(b) by 125 days.

(21) Appl. No.: 18/584,706

(22) Filed: Feb. 22, 2024

(65) Prior Publication Data

US 2024/0291497 A1 Aug. 29, 2024

(30) Foreign Application Priority Data

Feb. 23, 2023 (KR) ........................ 10-2023-0024623
Jan. 30, 2024 (KR) ........................ 10-2024-0014303

(51) Int. Cl.
*H03M 1/08* (2006.01)

(52) U.S. Cl.
CPC .................................... *H03M 1/08* (2013.01)

(58) Field of Classification Search
CPC ...... H03M 1/462; H03M 1/804; H03M 1/466; H03M 1/0604; H03M 1/468; H03M 3/426
See application file for complete search history.

(56) References Cited

U.S. PATENT DOCUMENTS

2008/0258959 A1* 10/2008 Trifonov ............... H03M 1/145
                                                        341/156
2022/0385299 A1* 12/2022 Fon ........................ H03M 1/125
2024/0187016 A1*  6/2024 Parupalli ............... H03M 1/804
(Continued)

FOREIGN PATENT DOCUMENTS

KR        10-1986699 B1    6/2019
KR    10-2023-0108188 A    7/2023

OTHER PUBLICATIONS

Li et al., "A 7.3-μ W 13-ENOB 98-dB SFDR Noise-Shaping SAR ADC With Duty-Cycled Amplifier and Mismatch Error Shaping", IEEE Journal of Solid-State Circuits, vol. 57, No. 7, 2022, Article 9766432, pp. 2078-2089 (13 pages total), https://doi.org/10.1109/JSSC.2022.3168588.

(Continued)

*Primary Examiner* — Mirza F Alam
(74) *Attorney, Agent, or Firm* — Sughrue Mion, PLLC

(57) ABSTRACT

The present invention relates to a successive approximation register (SAR) analog-to-digital converter and the SAR analog-to-digital converter according to an example embodiment includes an input unit including at least one SAR capacitor; a recycling integrator connected to the input unit and including k integration capacitors configured to store the respective residue information generated in an integration process performed k times, respectively, (where k denotes a positive integer of 2 or more) using a single amplifier; a comparator connected to an output terminal of the recycling integrator; and a SAR controller connected to an output terminal of the comparator and configured to generate a digital signal corresponding to output of the comparator.

8 Claims, 29 Drawing Sheets

(56) References Cited

U.S. PATENT DOCUMENTS

| 2024/0195429 A1* | 6/2024 | Hwang | .................. | H03M 1/466 |
| 2024/0204793 A1* | 6/2024 | Huang | .................. | H03M 1/468 |

OTHER PUBLICATIONS

Seong et al., "A Review of Noise Reduction Techniques in Noise-shaping SAR ADCs", Journal of Semiconductor Technology and Science, vol. 22, No. 6, Dec. 2022, pp. 436-451, https://doi.org/10.5573/JSTS.2022.22.6.436.

Communication issued Nov. 22, 2024 in Korean Application No. 10-2024-0014303.

Xiyuan Tang et al., "A 13.5-ENOB, 107-μW Noise-Shaping SAR ADC With PVT-Robust Closed-Loop Dynamic Amplifier," IEEE Journal of Solid-State Circuits, Dec. 2020, 12 pages, vol. 55 No. 12, IEE.

Yun-Shiang Shu et al., "An Oversampling SAR ADC with DAC Mismatch Error Shaping Achieving 105dB SFDR and 101dB SNDR over 1KHz BW in 55nm CMOS," IEEE International Solid-State Circuits Conference, Feb. 3, 2016, 3 pages, ISSCC.

* cited by examiner

$$Q = C_{SAR} \cdot V_{INP}[n-1]$$

820

$-V_{DOUT(P \rightarrow N)}[n-1]$ $Q = C_{SAR} \cdot V_{DOUTP}[n-1]$ $Q = C_{SAR} \cdot V_{DOUTN}[n-1]$

830

$$\Delta Q =$$
$$C_{SAR} \cdot |V_{INN}[n] - V_{DOUTN}[n-1]|$$
$$\approx 0$$

920

1010

1110

1120

1210

1230

SAR ANALOG-TO-DIGITAL CONVERTER WITH HIGH-ORDER NOISE-SHAPING CHARACTERISTICS

TECHNICAL FIELD

The present invention relates to a successive approximation register (SAR) analog-to-digital converter (ADC) and, more particularly, to the technical spirit of a noise-shaping SAR analog-to-digital converter.

RELATED ART

In wearable healthcare devices, it is important to accurately read biopotential signals (ExG), such as electrocardiography (ECG), electroencephalography (EEG), electromyography (EMG), and electrooculography (EOG), to track a wearer's health status.

To this end, an analog front end (AFE) provided to a wearable healthcare device to directly interface with a biopotential signal needs to have low input-referred-noise (IRN) of less than 5 Vrms to implement a high signal-to-noise ratio (SNR) and input impedance (Zm) needs to be high, greater than or equal to 10 MΩ, to prevent signal attenuation due to voltage division of electrode impedance and input of a system.

In particular, when a significant motion or excitation artifact is present, the analog front end needs to ensure that a linear-input-range (IR) of the system needs to satisfy the condition of 'IR>1V$_{pp}$' to prevent saturation and resulting distortion according thereto. To reduce battery recharge cycles, the analog front end needs to be as energy efficient (e.g., FOM$_{SNDR}$>175 dB) as possible and to achieve the target performance in a power envelope of less than 10 W.

The analog front end includes a low noise amplifier (LNA) and an analog-to-digital converter (ADC). Here, gain of the low noise amplifier ultimately limits the IR of the system, which leads to deriving a saturation state of the system, and accordingly, a high-resolution analog-to-digital converter needs to be applied to alleviate the IR limitation.

A representative high-resolution analog-to-digital converter is a noise-shaping successive approximation register (SAR) analog-to-digital converter shown in FIG. 1.

Referring to FIG. 1, an existing noise-shaping SAR analog-to-digital converter 100 may implement energy-efficient high-resolution analog-to-digital conversion results by combining a SAR analog-to-digital conversion structure and a delta-sigma modulation (DSM) structure.

In detail, in the SAR analog-to-digital converter 100, an input voltage is stored in a SAR capacitor (C$_{SAR}$) according to a sampling frequency, an input value goes through a comparison process by a comparator using residue information stored in an integrator as reference according to a binary searching algorithm, and through this, the input voltage is converted to a digital output code.

When this conversion process is completed, residue information remains in a top-plate of the SAR capacitor (C$_{SAR}$) and the SAR analog-to-digital converter 100 is controlled to store the same in the integrator before a next sampling process.

The SAR analog-to-digital converter 100 has advantages in improving energy efficiency and implementing high resolution but has limitations due to a high-order loop filter, low input impedance, and non-linear characteristics.

In detail, increasing the energy efficiency of the analog-to-digital converter involves a process of increasing order of the system and order of a loop filter inside the system needs to be increased to increase the order of the system.

However, in general, to design the high-order loop filter, the number of integrators corresponding to the system order are required and the number of input terminals of the comparator increases. This increase in the number of integrators increases complexity of the overall system and unnecessary power consumption and the comparator with the increased number of input terminals causes an increase in circuit noise, making it difficult to design the comparator with optimized noise.

Also, the noise-shaping SAR analog-to-digital converter requires a sampling process at an input terminal and sampling noise (kT/C) has a major impact on the noise performance of the entire system due to a sampling process at the front end of the system.

To reduce this sampling noise, a size of a sampling capacitor needs to be increased. However, considering that input impedance of the system has an inverse relationship with a sampling frequency and the sampling capacitor, increasing the sampling capacitor may result in degrading the input impedance of the system. Accordingly, due to a degradation in the input impedance of the system, additional power consumption occurs in a front-end driver of the analog-to-digital converter.

Also, to solve a linearity problem of the system in the analog-to-digital converter, it is essential to apply technology that resolves mismatch of DAC (digital-to-analog converter) elements, that is, capacitors used in the analog-to-digital converter. Accordingly, a calibration process of increasing the linearity is required.

However, when applying foreground calibration to resolve the mismatch of the DAC elements, it may be easily affected by an environmental change and additional power and time needs to be consumed to apply the background calibration.

RELATED ART DOCUMENTS

Patent Documents (Patent document 1) Korean Patent Registration No. 10-1986699, tilted "successive approximation register analog-to-digital converter and operating method thereof." (Patent document 2) Korean Patent Laid-Open Publication No. 10-2023-0108188, titled "analog-to-digital converter and analog-to-digital conversion method using the same."

Non-Patent Documents (Non-patent document 1) X. Tang et al., "A 13.5-ENOB, 107-μW noise-shaping SAR analog-to-digital converter with PVT-Robust closed-loop dynamic amplifier," IEEE J. solid-state circuits, vol. 55, no. 12, pp. 3248-3259, December 2020.
(Non-patent document 2) Y.-S. Shu et al., "27.2 an over-sampling SAR analog-to-digital converter with DAC mismatch error shaping achieving 105 dB SFDR and 101 dB SNDR over 1 kHz BW in 55 nm CMOS," ISSCC Dig. Tech. Papers, pp. 458-459, February 2016.

DETAILED DESCRIPTION

Subject

The present invention provides a successive approximation register (SAR) analog-to-digital converter that may perform a high-order integration process by recycling a single amplifier provided to an integrator, thereby overcoming limitations of the existing high-order loop filter and securing space margin.

Also, the present invention provides a SAR analog-to-digital converter that may amplify input impedance by reusing information stored through sampling.

Also, the present invention provides a SAR analog-to-digital converter that may improve the linearity of a system by solving a mismatch problem of a SAR capacitor through a clock-averaged (CLA) element matching process.

Solution

A successive approximation register (SAR) analog-to-digital converter according to an example embodiment of the present invention may include an input unit including at least one SAR capacitor; a recycling integrator connected to the input unit and including k integration capacitors configured to store the respective residue information generated in an integration process performed k times, respectively, (where k denotes a positive integer of 2 or more) using a single amplifier; a comparator connected to an output terminal of the recycling integrator; and a SAR controller connected to an output terminal of the comparator and configured to generate a digital signal corresponding to output of the comparator.

According to an aspect, the input unit may be configured to store an input voltage received through an (n–1)-th (where n denotes a positive integer of 2 or more) sampling process in the SAR capacitor as an (n–1)-th input signal.

According to an aspect, the SAR analog-to-digital converter may further include a clock-averaged (CLA) element matching unit and a digital-to-analog conversion controller provided on a loop that connects the SAR controller and the SAR capacitor.

According to an aspect, the digital-to-analog conversion controller may be configured to convert a bottom-plate of the SAR capacitor to a digital signal corresponding to the (n–1)-th input signal through a (n–1)-th SAR conversion process corresponding to the (n–1)-th sampling process and to amplify input impedance by restoring a top-plate of the SAR capacitor to an n-th input signal based on the digital signal corresponding to the (n–1)-th input signal when performing an n-th sampling process.

According to an aspect, the digital-to-analog conversion controller may be configured to restore the top-plate of the SAR capacitor to the n-th input signal by changing a sign of the digital signal corresponding to the (n–1)-th input signal of the bottom-plate of the SAR capacitor and then switching to a common-mode level.

According to an aspect, the CLA element matching unit may be configured to perform a CLA element matching process of controlling locations of 1 (where 1 denotes a positive integer) DAC elements corresponding to a most significant bit (MSB) or a least significant bit (LSB) among a plurality of DAC elements to rotate at each sampling period through an (n–1)-th SAR conversion process corresponding to the (n–1)-th sampling process.

According to an aspect, the recycling integrator may be configured to store residue information generated in a first integration process in a first integration capacitor, to store residue information generated in a second integration process in a second integration capacitor, and to connect in series the SAR capacitor, the first integration capacitor, and the second integration capacitor before an n-th SAR conversion process corresponding to an n-th sampling process is performed, and to reduce input of the comparator to one.

According to an aspect, the recycling integrator may be configured to, in the first integration process, connect the SAR capacitor to the first integration capacitor and the common integration capacitor and store the (n–1)-th input signal in each of the first integration capacitor and the common integration capacitor as residue information generated in the first integration process, and to, in the second integration process, connect the common integration capacitor and the second integration capacitor and store the residue information stored in the common integration capacitor in the second integration capacitor as residue information generated in the second integration process.

According to an aspect, the recycling integrator may further include a plurality of SAR switches configured to control a connection between the SAR capacitor and the first integration capacitor and a connection between the first integration capacitor and the second integration capacitor; a plurality of first integration switches configured to control the connection between the SAR capacitor and the first integration capacitor and the connection between the first integration capacitor and the common integration capacitor; and a plurality of second integration switches configured to control a connection between the second integration capacitor and the common integration capacitor.

According to an aspect, the amplifier may be a reconfigurable transconductance amplifier (RTA) in which bias current of an output stage is variable.

Effect

According to an example embodiment, the present invention may overcome limitations of the existing high-order loop filter and may secure space margin by performing a high-order integration process by recycling a single amplifier provided to an integrator.

Also, the present invention may amplify input impedance by reusing information stored through sampling.

Also, the present invention may improve the linearity of a system by solving a mismatch problem of a SAR capacitor through an element matching process.

BRIEF DESCRIPTION OF DRAWINGS

Figure 4A:
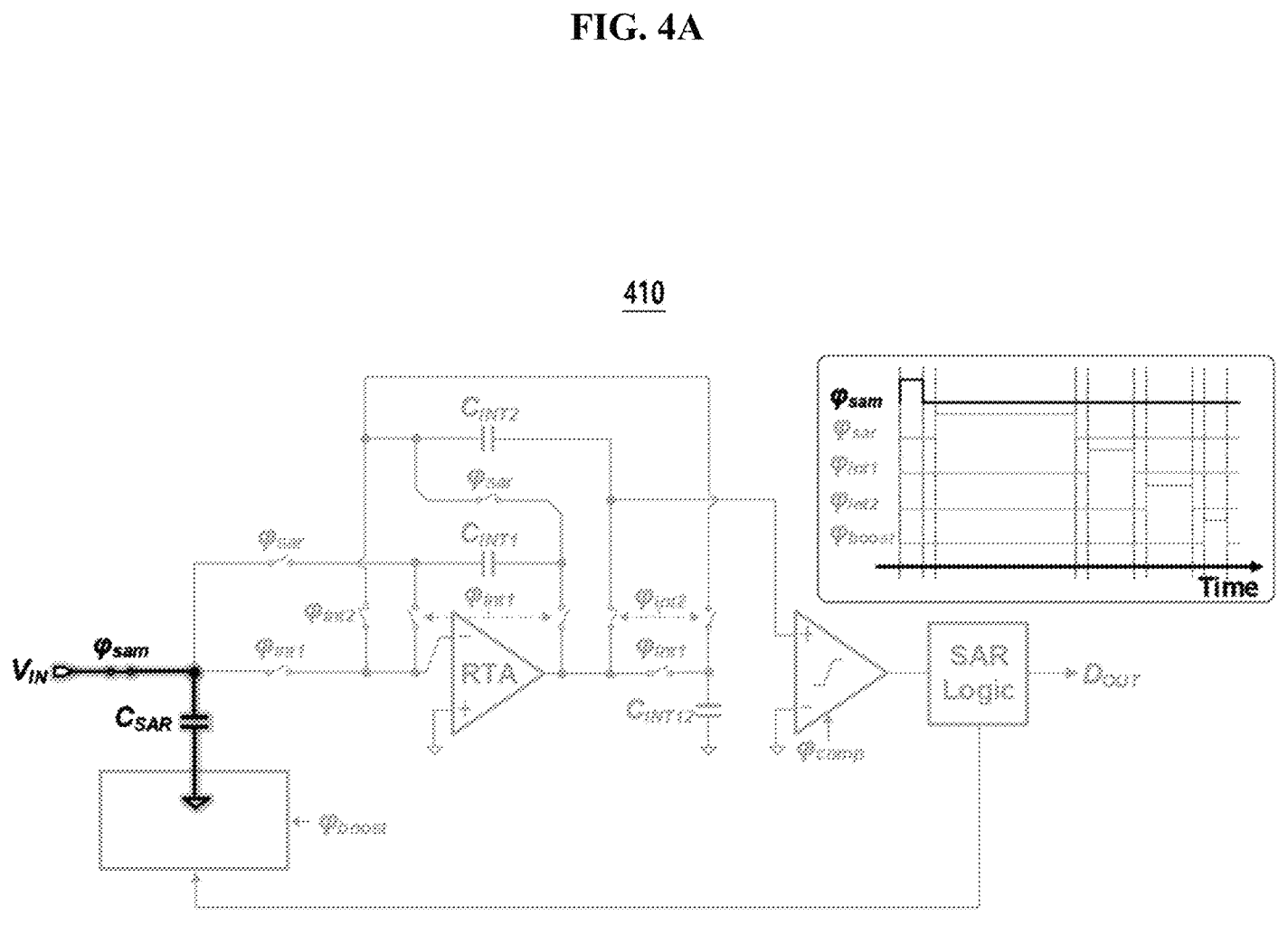
Figure 4B:
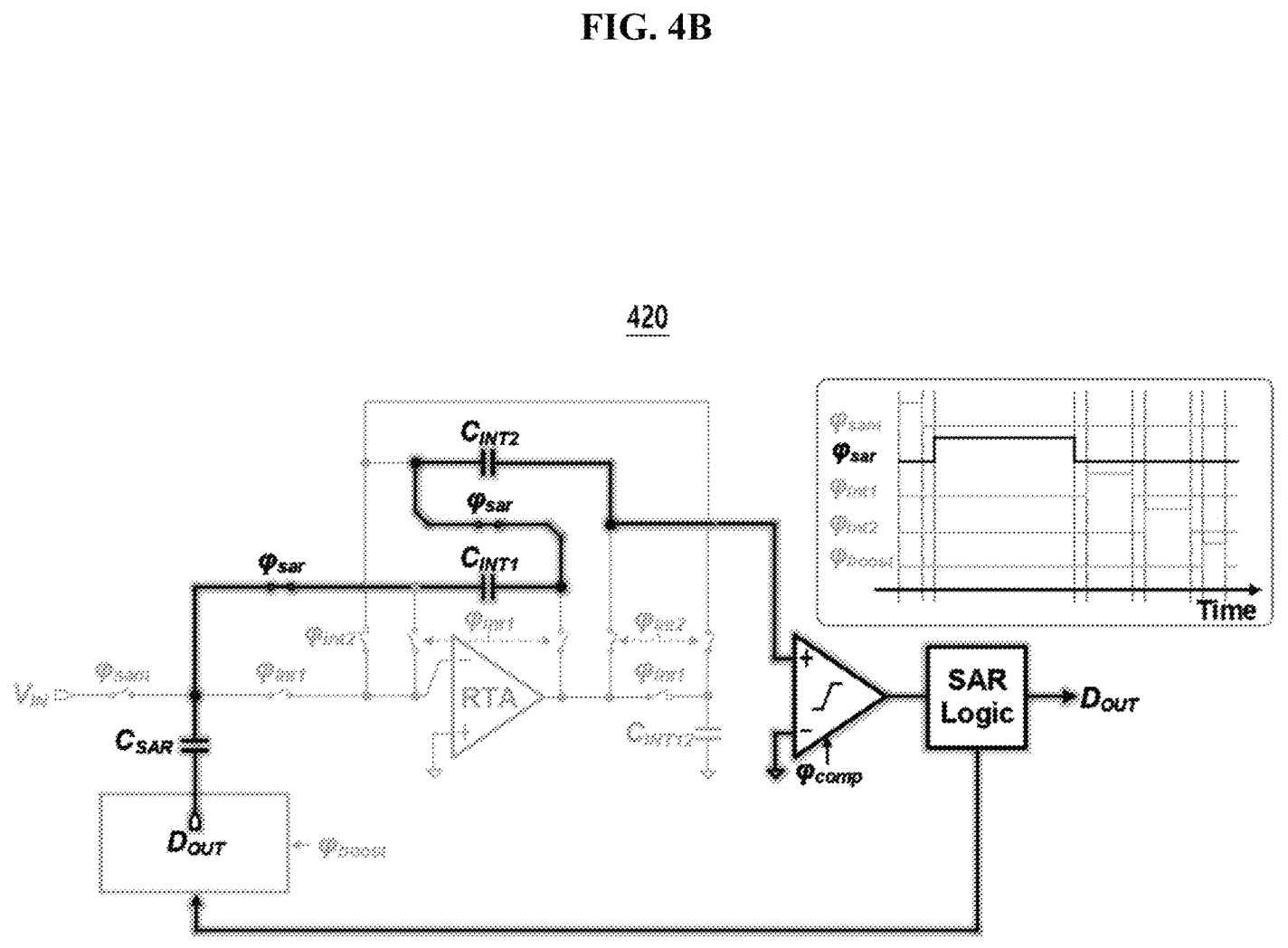

FIGS. 4A to 4D illustrate an operating method of a SAR analog-to-digital converter according to an example embodiment.

5

Figure 1:
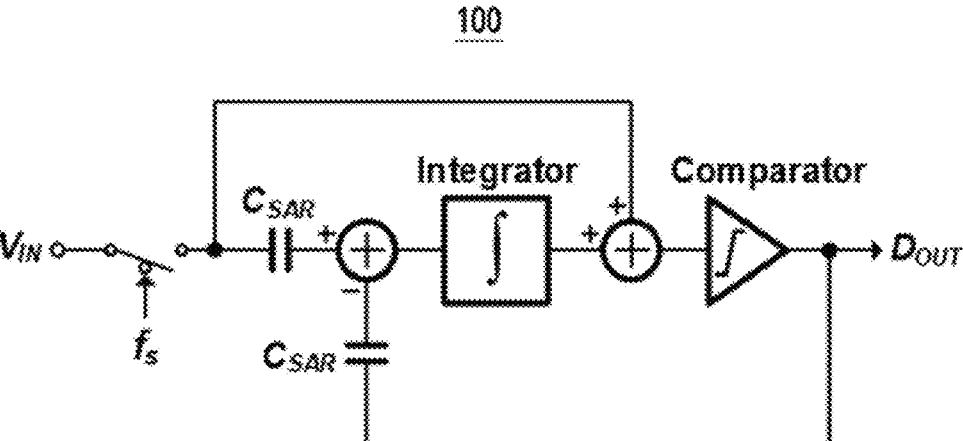
FIG. 1 illustrates a successive approximation register (SAR) analog-to-digital converter according to the related art.

FIGS. 9A to 12C illustrate performance test results of a SAR analog-to-digital converter according to an example embodiment.

MODE

Hereinafter, various example embodiments will be described with reference to the accompanying drawings.

The example embodiments and the terms used herein are not construed to limit technology described herein to specific implementations and should be understood to include various modifications, equivalents, and/or substitutions of corresponding example embodiments.

When it is determined that detailed description related to a relevant known function or configuration may make the disclosure unnecessarily ambiguous in describing various example embodiments in the following, the detailed description will be omitted.

The following terms refer to terms defined in consideration of functions of various example embodiments and may differ depending on a user, the intent of an operator, or custom. Accordingly, the terms should be defined based on the overall contents in the present specification.

In relation to explaining drawings, like reference numerals refer to like elements.

The singular forms "a," "an," and "the" are intended to include the plural forms as well, unless the context clearly indicates otherwise.

Herein, expressions, such as "A or B" and "at least one of A and/or B," may include all possible combinations of listed items.

Expressions, such as "first," "second," etc., may describe corresponding components regardless of order or importance and may be simply used to distinguish one component from another component and do not limit the corresponding components.

When it is described that one (e.g., first) component is "(functionally or communicatively) connected" or "accessed" to another (e.g., second) component, the component may be directly connected to the other component or may be connected thereto through still another component (e.g., third component).

Herein, "configured (or set) to ~" may be interchangeably used with, for example, "suitable for ~," "having capability of ~," "changed to ~," "made to ~," "capable of ~," or "designed to ~" in a hardware manner or a software manner, depending on situations.

In a situation, the expression "device configured to ~" may represent that the device is "capable of" interworking with another device or parts.

For example, the phrase "processor configured (or set) to perform A, B, and C" may refer to a dedicated processor (e.g., embedded processor) for performing a corresponding operation or a general-purpose processor (e.g., central processing unit (CPU) or application processor) capable of performing corresponding operations by executing one or more software programs stored in a memory device.

Also, the term "or" represents "inclusive or" rather than "exclusive or."

That is, unless otherwise stated or clear from the context, the expression "x uses a or b" represents any one of natural inclusive permutations.

In the detailed example embodiments, a component included in the invention is expressed as the singular form or the plural form depending on detailed example embodiments.

However, singular or plural expressions are selected to suit the presented situation for clarity of description and the example embodiments are not limited to singular or plural components. Also, even components expressed in the plural form may be configured in the singular form, or even components expressed in the singular form may be configured in the plural form.

Meanwhile, although the description of the invention describes specific example embodiments, it will be apparent that various modifications may be made without departing from the scope of the technical spirit of various example embodiments.

Therefore, the scope of the present invention should not be limited to the example embodiments and should be defined by the claims and the equivalents thereto.

Figure 2:
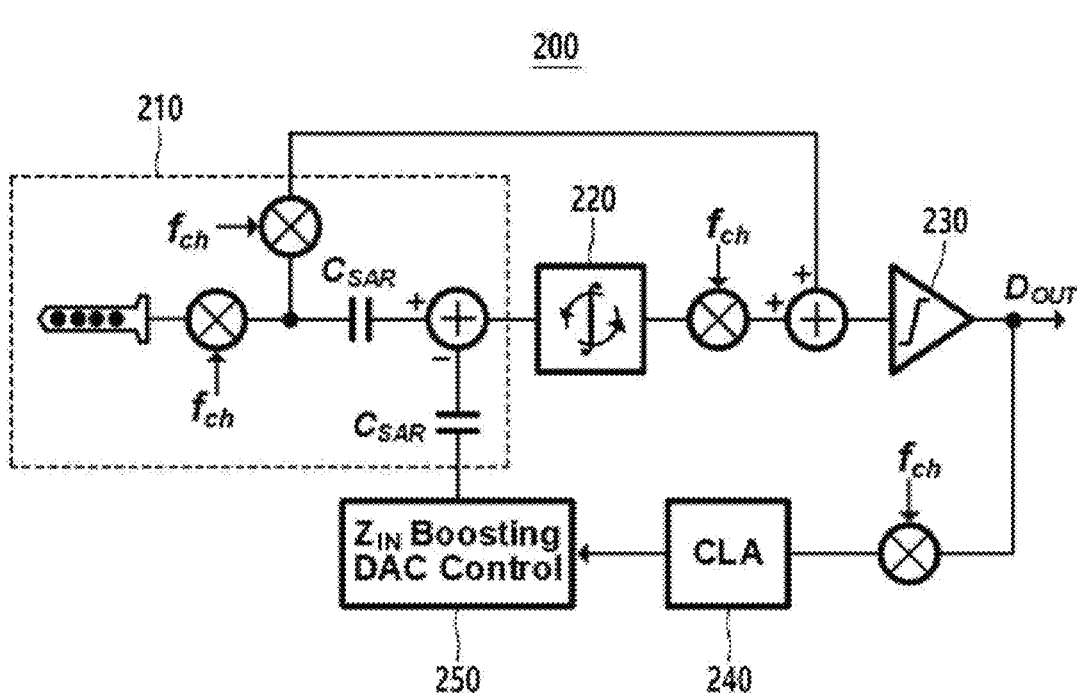
FIG. 2 illustrates a SAR analog-to-digital converter according to an example embodiment.

FIG. 2 illustrates a successive approximation register (SAR) analog-to-digital converter according to an example embodiment.

Referring to FIG. 2, a SAR analog-to-digital converter 200 according to an example embodiment may perform a high-order integration process by recycling a single amplifier provided to an integrator, thereby overcoming limitations of the existing high-order loop filter and may securing space margin.

Also, the SAR analog-to-digital converter 200 may amplify input impedance by reusing information stored through sampling.

Also, the SAR analog-to-digital converter 200 may improve the linearity of a system by resolving a mismatch problem of a SAR capacitor ($C_{SAR}$) through a clock-averaged (CLA) element matching process.

In detail, the SAR analog-to-digital converter 200 may be designed to have a bandwidth of 1 kHz and input range of 1.85 $V_{pp}$ at supply voltage of 1V and may achieve key performance indicators, a figure of merit for signal-to-noise and distortion ratio ($FOM_{SNDR}$) and a figure of merit for distortion ratio ($FOM_{DR}$), at 179.4 dB and 181.9 dB, respectively.

Also, the SAR analog-to-digital converter 200 may be a k-order (here, k denotes a positive integer of 2 or more) noise-shaping SAR based on a SAR quantizer and a single integrator. Although the SAR analog-to-digital converter 200 is illustrated as a secondary noise-shaping SAR for clarity of description, it is provided as an example only.

Also, system level chopping technology may be applied to the SAR analog-to-digital converter 200 to remove flicker noise occurring in a low band.

To this end, the SAR analog-to-digital converter 200 may include an input unit 210, a recycling integrator 220, a comparator 230, a SAR controller (e.g., SAR logic), a CLA element matching unit 240, and a digital-to-analog conversion controller 250. Here, the CLA element matching unit 240 and the digital-to-analog conversion controller 250 may be provided on a loop that connects the SAR controller and the SAR capacitor ($C_{SAR}$).

Control signals for driving the SAR analog-to-digital converter 200 described below may be generated through a separately provided signal generator and may be applied to each element. However, without being limited thereto, the SAR controller may perform the functionality of the signal generator.

Also, '$f_{ch}$' shown in FIG. 2 refers to a frequency of an analog signal to be converted to a digital signal.

The input unit 210 according to an example embodiment may include at least one SAR capacitor ($C_{SAR}$).

According to an aspect, the input unit 210 may store an input voltage received through an (n−1)-th (here, n denotes a positive integer of 2 or more) sampling process in the SAR capacitor ($C_{SAR}$) as an (n−1)-th input signal. Residue information of the SAR capacitor ($C_{SAR}$) described below may represent an input signal stored in the SAR capacitor ($C_{SAR}$).

The recycling integrator 220 according to an example embodiment may be connected to the input unit 210 and may include k integration capacitors configured to store the respective residue information generated in an integration process performed k times using a single amplifier, respectively.

For example, the amplifier may be a reconfigurable transconductance amplifier (RTA) in which bias current of an output stage is variable.

According to an aspect, the recycling integrator 220 may implement a secondary noise-shaping characteristic by including a first integration capacitor and a second integration capacitor.

In detail, the, the recycling integrator 220 may store residue information (i.e., residual voltage) generated in a first integration process in the first integration capacitor, may store residue information generated in a second integration process in the second integration capacitor, may connect in series the SAR capacitor ($C_{SAR}$), the first integration capacitor, and the second integration capacitor before an n-th SAR conversion process corresponding to an n-th sampling process is performed, and, through this, may reduce input of the comparator 230 to one.

In more detail, the recycling integrator 220 may perform a passive summation of integrating the residue information stored in the SAR capacitor ($C_{SAR}$), the residue information stored in the first integration capacitor, and the residue information stored in the second integration capacitor by connecting in series the SAR capacitor ($C_{SAR}$), the first integration capacitor, and the second integration capacitor, and may provide results of the passive summation as input of the comparator 230.

The comparator 230 according to an example embodiment may be connected to an output terminal of the recycling integrator and the SAR controller according to an example embodiment may generate a digital signal (i.e., digital output code) corresponding to output of the comparator 230.

The CLA element matching unit 240 according to an example embodiment may perform a CLA element matching process of controlling locations of 1 (here, 1 denotes a positive integer) DAC elements corresponding to a most significant bit (MSB) or a least significant bit (LSB) among a plurality of DAC elements to rotate at each sampling period through an (n−1)-th SAR conversion process corresponding to an (n−1)-th sampling process.

The digital-to-analog conversion controller 250 according to an example embodiment may convert a bottom-plate of the SAR capacitor ($C_{SAR}$) to a digital signal corresponding to the (n−1)-th input signal through a (n−1)-th SAR conversion process corresponding to the (n−1)-th sampling process and may amplify input impedance by restoring a top-plate of the SAR capacitor to an n-th input signal based on the digital signal corresponding to the (n−1)-th input signal when performing the n-th sampling process.

In detail, the digital-to-analog conversion controller 250 may restore the top-plate of the SAR capacitor ($C_{SAR}$) to the n-th input signal by changing a sign of the digital signal corresponding to the (n−1)-th input signal of the bottom-plate of the SAR capacitor ($CSAR$) and then switching to a common-mode level.

The SAR analog-to-digital converter 200 according to an example embodiment will be described in more detail with reference to FIGS. 3A to 8C.

Figure 3A:
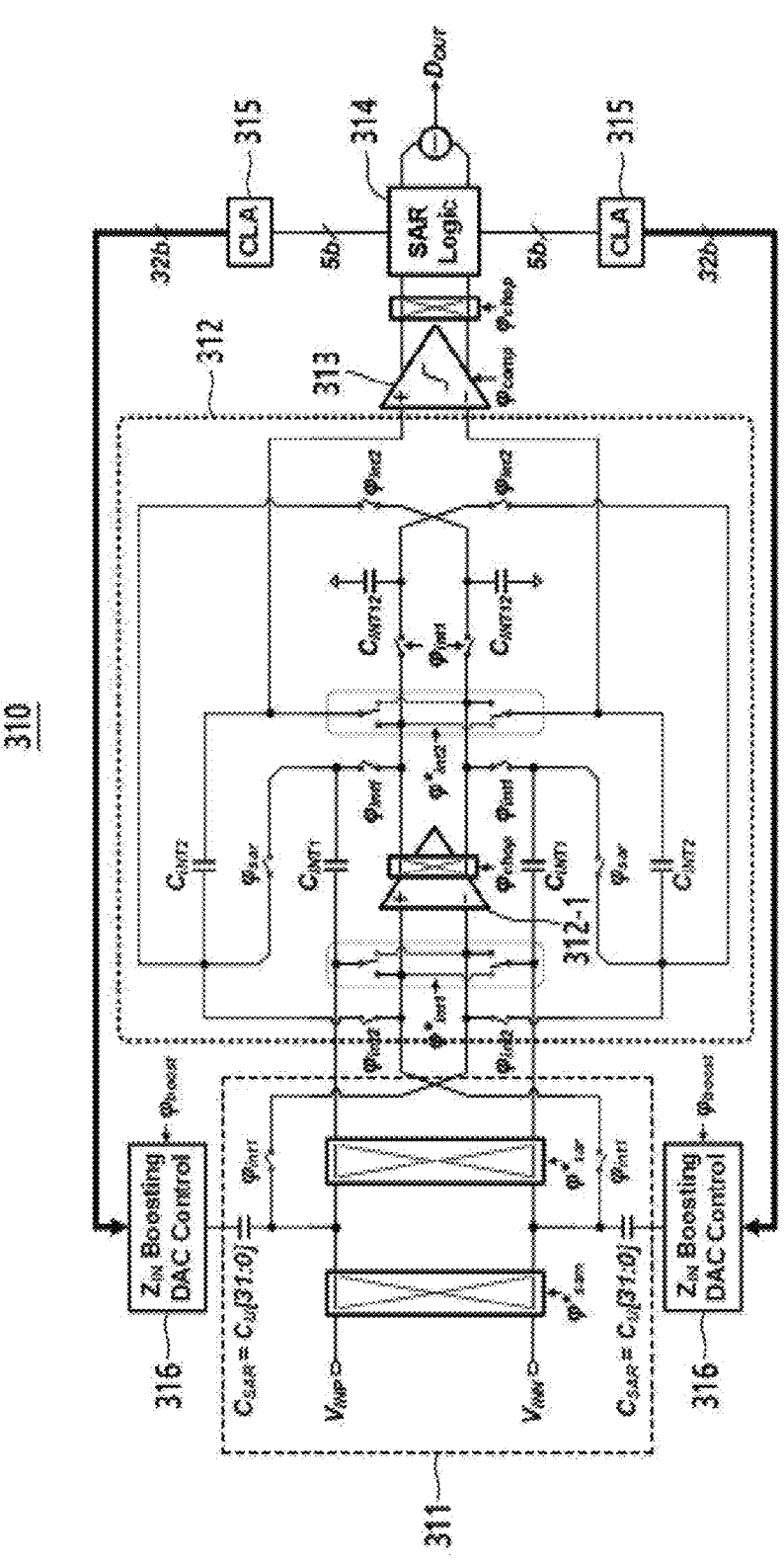
FIGS. 3A and 3B illustrate implementation examples of a SAR analog-to-digital converter according to an example embodiment.
Figure 3B:
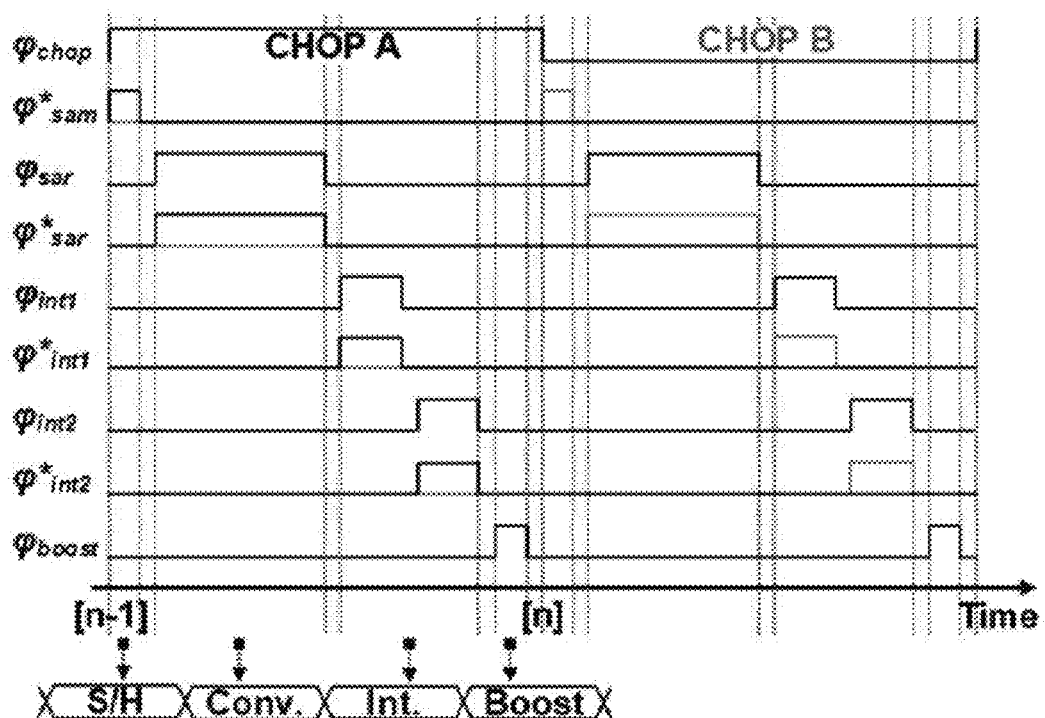
Figure 4C:
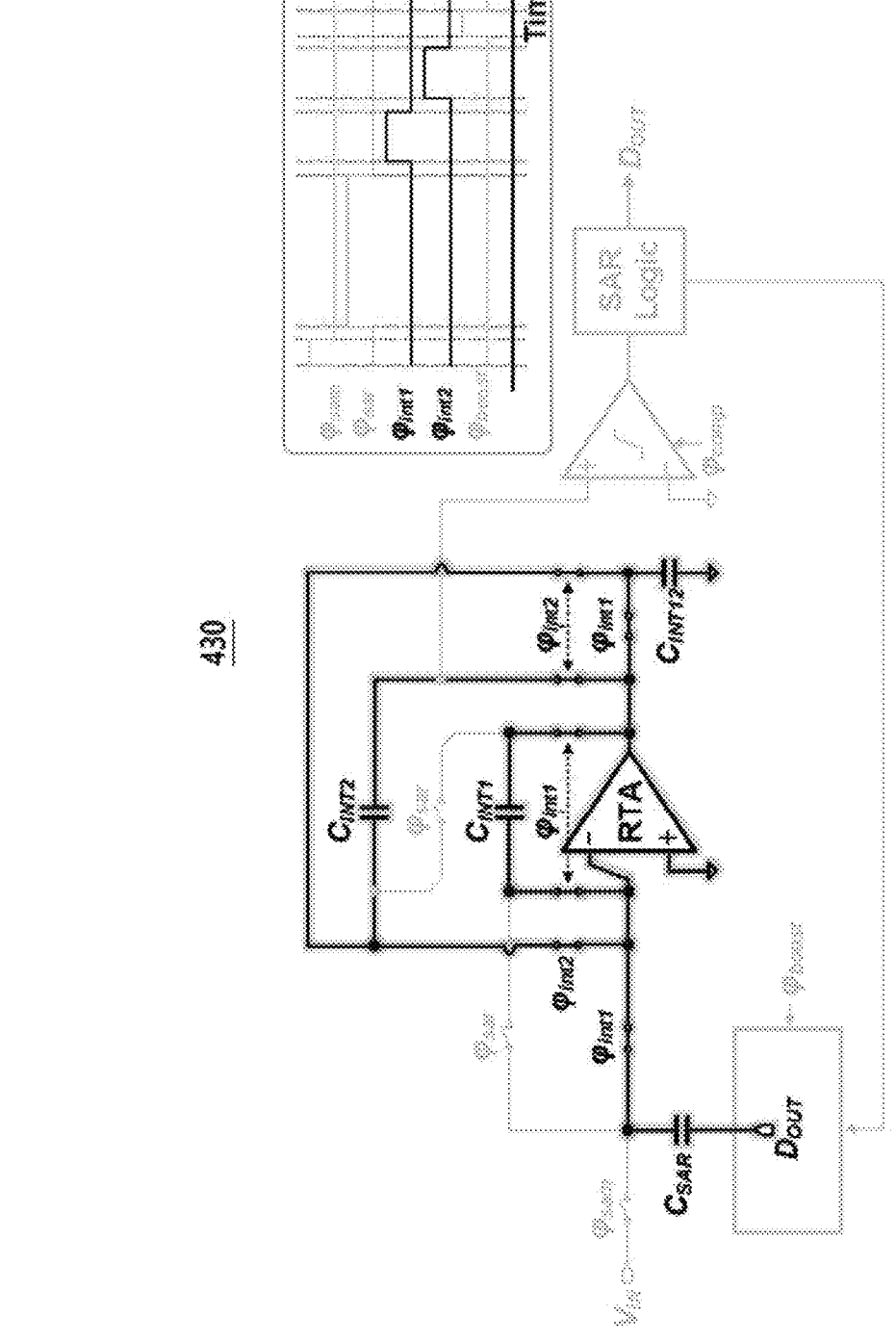
Figure 4D:
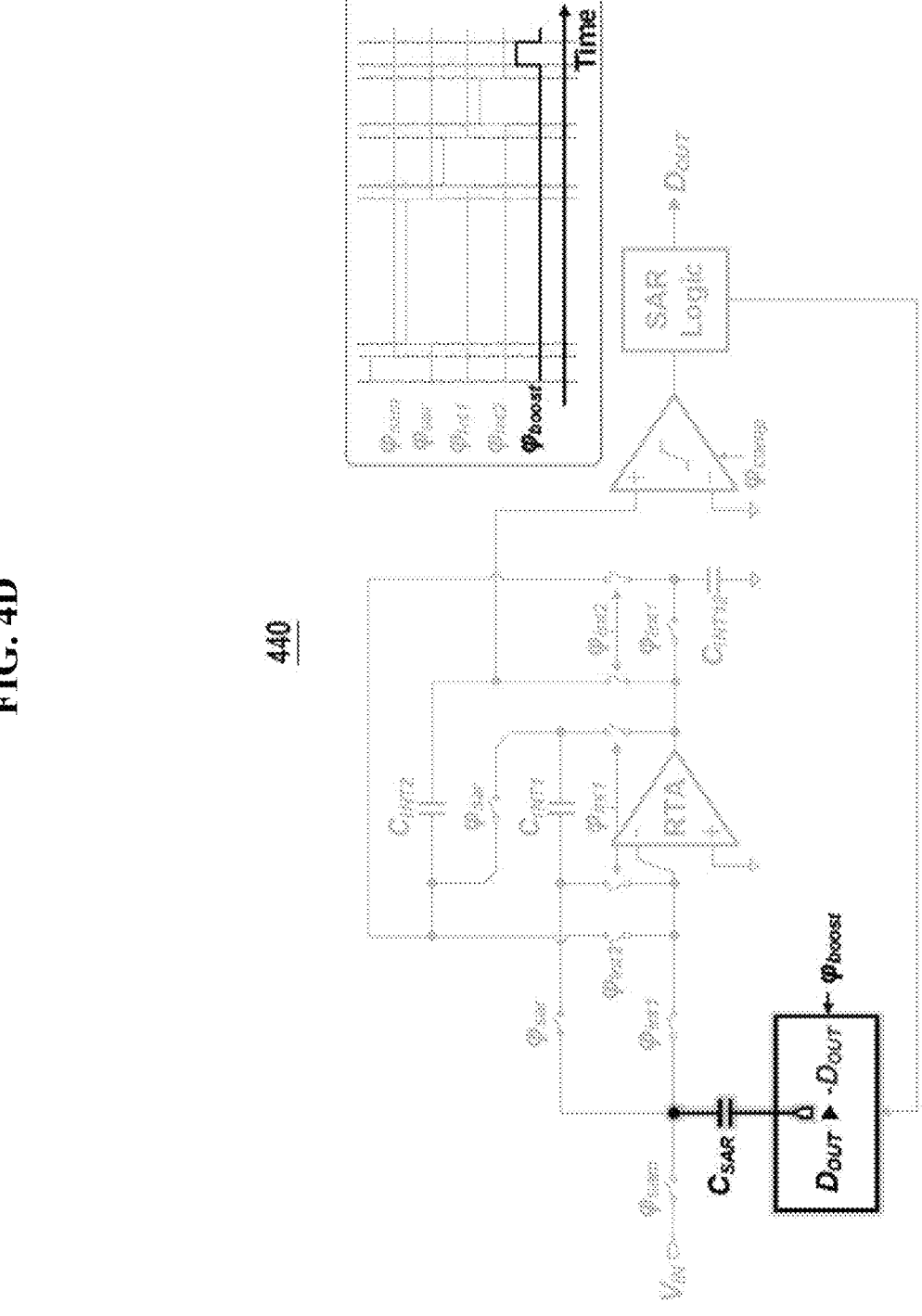
Figure 5A:
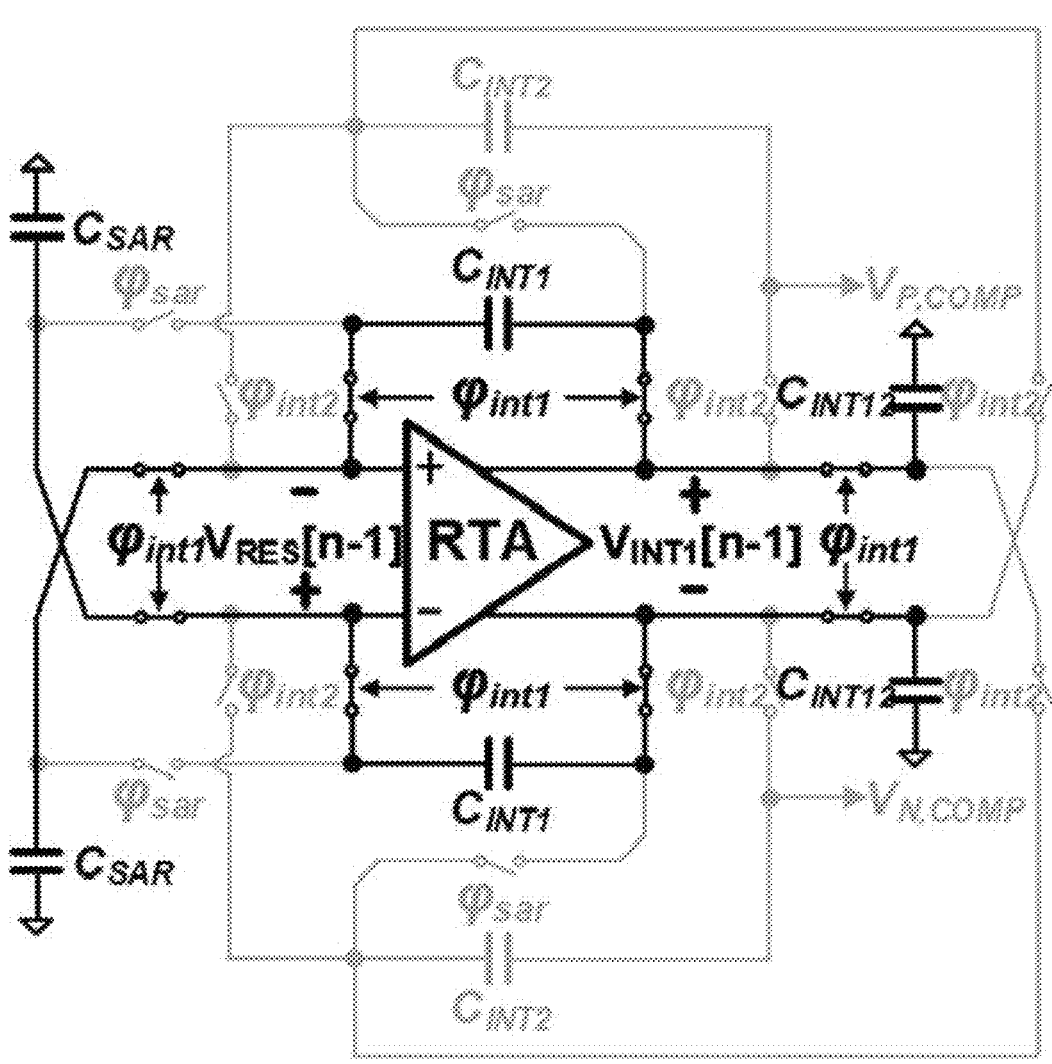
FIGS. 5A to 5D illustrate in detail an operating method of a recycling integrator according to an example embodiment.
Figure 5B:
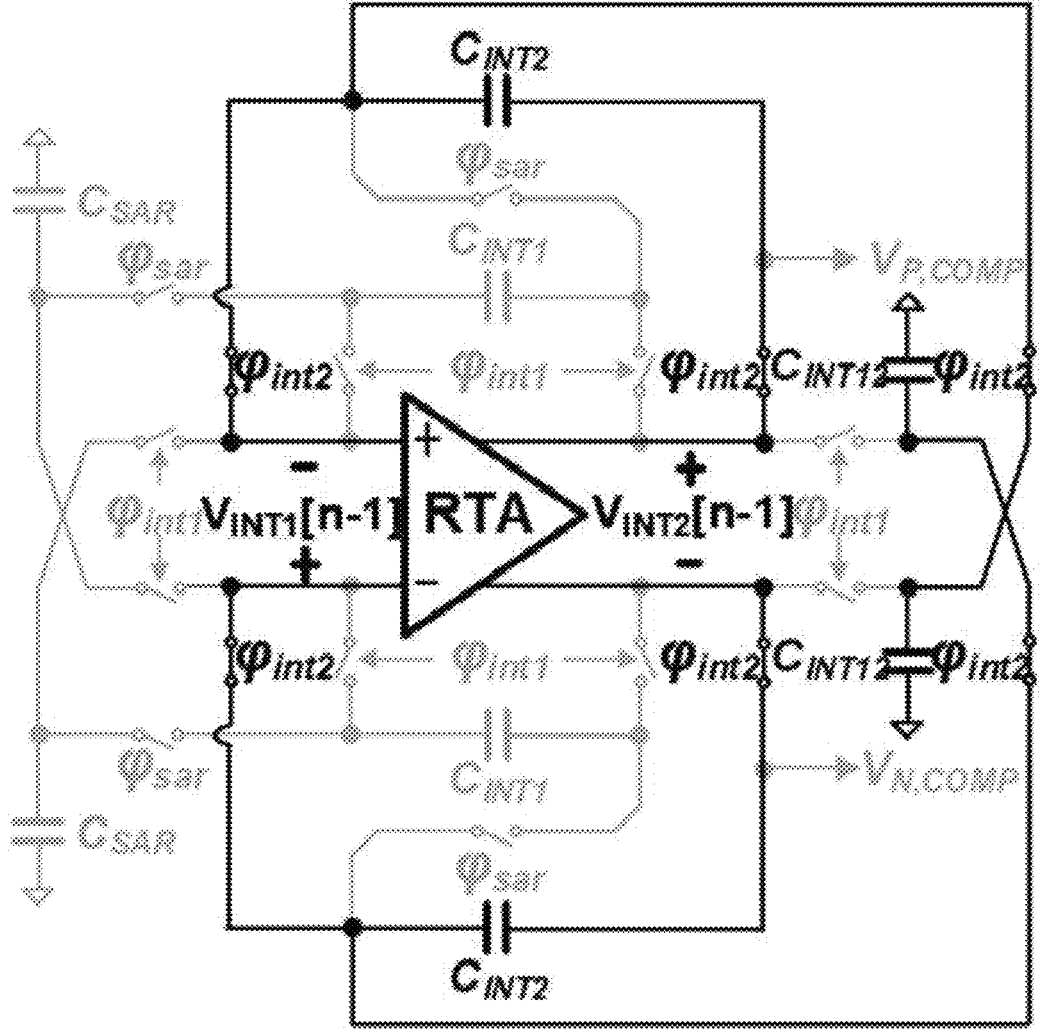
Figure 5C:
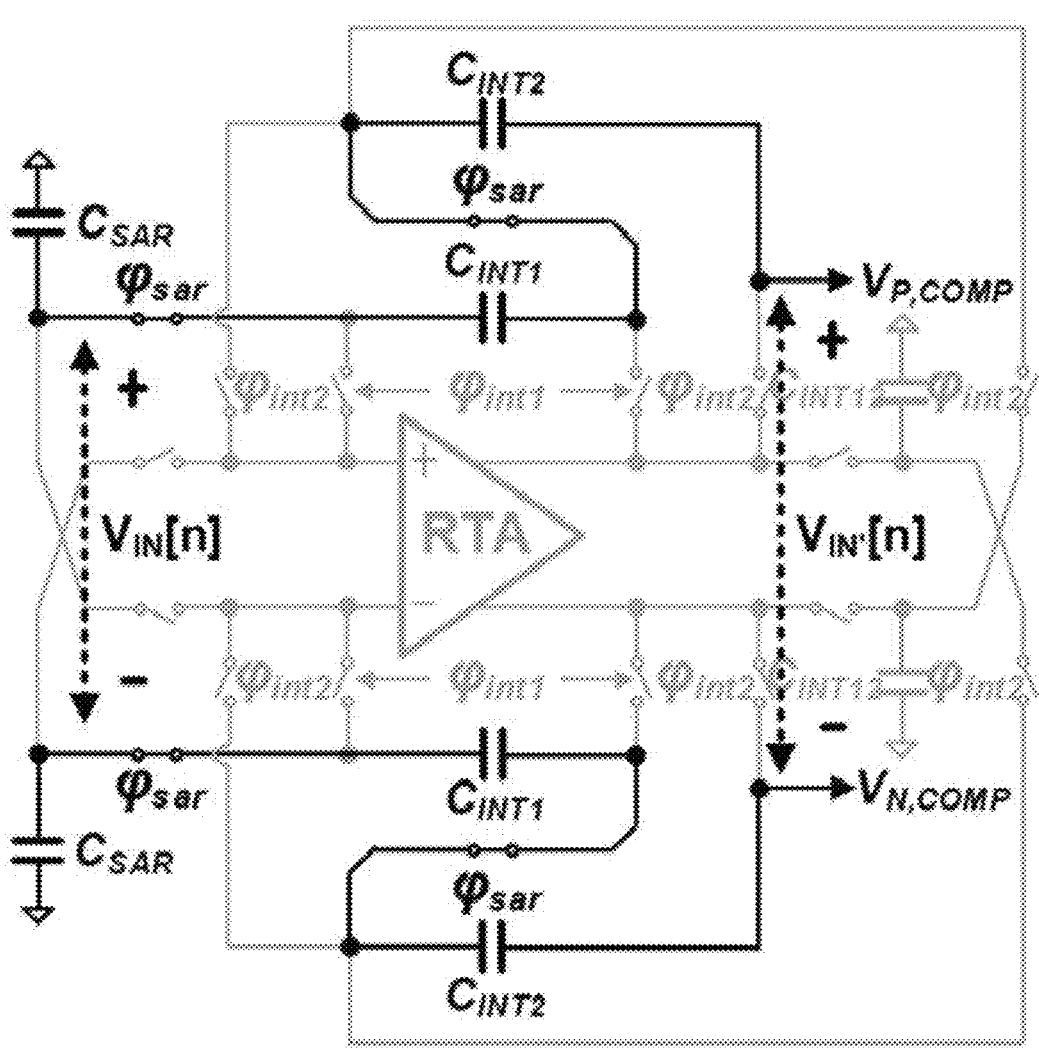
Figure 5D:
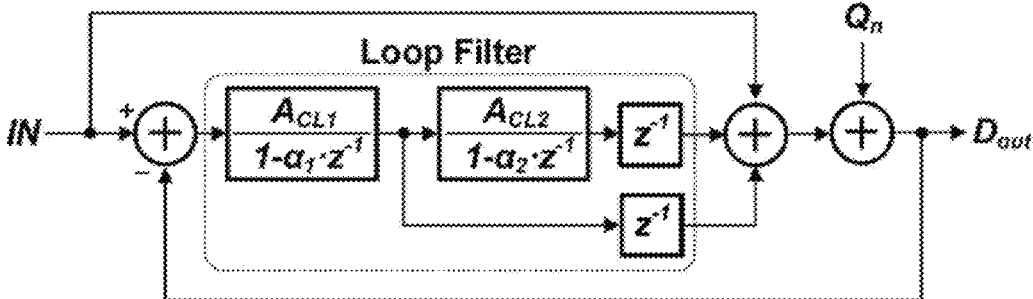

FIGS. 3A and 3B illustrate implementation examples of a SAR analog-to-digital converter according to an example embodiment.

Referring to FIGS. 3A and 3B, reference numeral 310 illustrates results of implementing the SAR analog-to-digital converter as a secondary noise-shaping SAR and reference numeral 320 illustrates a timing diagram for driving the SAR analog-to-digital converter of reference numeral 310.

Referring to reference numeral 310, the SAR analog-to-digital converter 310 may include an input unit 311, a recycling integrator 312, a comparator 313, a SAR controller 314, a CLA element matching unit 315, and a digital-to-analog conversion controller 316.

Also, the input unit 311 may include a plurality of input terminals ($V_{INP}$ and $V_{INV}$) configured to receive an input voltage. Here, a chopper may be provided to wiring connected to the plurality of input terminals ($V_{INP}$ and $V_{INN}$) and wiring that connects the comparator 313 and the SAR controller 314.

In detail, the SAR analog-to-digital converter 310 may include a 5b SAR quantizer and a single integrator (i.e., recycling integrator 312) and capacitance of the SAR capacitor ($C_{SAR}$) may be set to 8.1 pF and a sampling frequency may be set to 128 kHz to meet the requirements of sampling noise (kT/C).

The recycling integrator 312 may include a single amplifier, a first integration capacitor ($C_{INT1}$), a second integration capacitor ($C_{INT2}$), and a common integration capacitor ($C_{INT12}$) and, through this, may implement secondary noise-shaping at lower cost.

For example, the recycling integrator 312 may include a plurality of SAR switch devices configured to control a connection between the SAR capacitor ($C_{SAR}$) and the first integration capacitor ($C_{INT1}$) and a connection between the first integration capacitor ($C_{INT1}$) and the second integration capacitor ($C_{INT2}$) based on SAR conversion control signals ($\varphi_{sar}$, $\varphi_{sar}$*).

Also, the recycling integrator 312 may include a plurality of first integration switches configured to control the connection between the SAR capacitor ($C_{SAR}$) and the first integration capacitor ($C_{INT1}$) and the connection between the first integration capacitor ($C_{INT1}$) and the common integration capacitor ($C_{INT12}$) based on first integration control signals ($\varphi_{int}$, $\varphi_{int1}$*).

Also, the recycling integrator 312 may include a plurality of second integration switches configured to control a connection between the second integration capacitor ($C_{INT2}$) and the common integration capacitor ($C_{INT12}$) based on second integration control signals ($\varphi_{int2}$, $\varphi_{int2}$*).

In detail, the recycling integrator 312 may reduce the complexity of the system by reducing two integrators (i.e., two amplifiers) minimally required for the existing secondary noise-shaping to a single integrator (i.e., a single amplifier).

Also, the recycling integrator 312 may store residue information generated in the respective integration processes (i.e., first integration process and second integration process) in the first integration capacitor ($C_{INT1}$) and the second integration capacitor ($C_{INT2}$), respectively, and then may reduce the input of the comparator 313 to one by connecting in series the first integration capacitor ($C_{INT1}$) and the second integration capacitor ($C_{INT2}$) to the SAR capacitor ($C_{SAR}$) before a subsequent SAR conversion process is performed. Through this, the noise-optimized comparator 313 may be designed.

To solve a mismatch problem of the SAR capacitor ($C_{SAR}$), the CLA element matching unit 315 may improve linearity of the system by introducing CLA element matching technology.

In detail, by rotating locations of DAC elements (e.g., plurality of capacitors) responsible for from an MSB to an LSB every sampling process, the CLA element matching unit 315 may achieve the effect of averaging errors of each of the DAC elements and, based thereon, may improve the linearity of the system.

The digital-to-analog conversion controller 316 may control a switch array required for operating a SAR to reuse information stored through previous sampling to amplify input impedance.

According to reference numeral 320, the SAR analog-to-digital converter 310 may sequentially perform a sample-and-hold process (hereinafter, sampling process) (S/H), a SAR conversion process (Conv.), a high-order integration process (Int.), and an impedance boosting process (Boost) during a section in which a chopping signal ($\varphi_{chop}$) is activated.

In detail, a sampling control signal ($\varphi_{sam}$) may be activated in the sampling process (S/H), SAR conversion control signals ($\varphi_{sar}$, $\varphi_{sar}*$) may be activated in the SAR conversion process (Conv.), first integration control signals ($\varphi_{int1}$, $\varphi_{int1}*$) and second integration control signals ($\varphi_{int2}$, $\varphi_{int2}*$) may be sequentially activated in the high-order integration process (Int.), and a boosting control signal ($\varphi_{boost}$) may be activated in the impedance boosting process (Boost).

FIGS. 4A to 4D illustrate an operating method of a SAR analog-to-digital converter according to an example embodiment.

Referring to FIGS. 4A to 4D, in operation 410, when a sampling control signal ($\varphi_{sam}$) is activated, the SAR analog-to-digital converter may perform a sampling process in which a SAR capacitor ($C_{SAR}$) is charged by an input voltage.

In operation 420, when a SAR conversion control signal ($\varphi_{sar}$) is activated, the SAR analog-to-digital converter may perform a SAR conversion process of adding residue information of a first integration capacitor ($C_{INT1}$) and a second integration capacitor ($C_{INT2}$) stored in a previous sampling process to residue information stored in the SAR capacitor ($C_{SAR}$) through a passive summation, transmitting the added residue information to a comparator through one input wiring, and generating a digital signal through a comparison process.

In operation 430, when the SAR conversion process is completed, the SAR analog-to-digital converter may generate residue information on an input signal in a top-plate of the SAR capacitor ($C_{SAR}$) and may transmit residue information of the top-plate to a recycling integrator for subsequent SAR conversion.

In operation 430, when a first integration control signal ($\varphi_{int1}$) and a second integration control signal ($\varphi_{int2}$) are sequentially activated, the SAR analog-to-digital converter may perform a first integration process and a second integration process.

In operation 440, when a boosting control signal ($\varphi_{boost}$) is activated, the SAR analog-to-digital converter may control a digital-to-analog conversion controller to perform an impedance boosting process of amplifying input impedance.

Here, the impedance boosting process may be performed before a subsequent sampling process. That is, an (n−1)-th impedance boosting process corresponding to an (n−1)-th sampling process may be performed before an n-th sampling process.

FIGS. 5A to 5D illustrate in detail an operating method of a recycling integrator according to an example embodiment.

Referring to FIGS. 5A to 5D, in operation 510, when a first integration control signal ($\varphi_{int1}$) is activated and a first integration process corresponding to an (n−1)-th sampling process is performed, the recycling integrator may connect a SAR capacitor ($C_{SAR}$) to a first integration capacitor ($C_{INT1}$) and a common integration capacitor ($C_{INT12}$) and may store an (n−1)-th input signal stored in the SAR capacitor ($C_{SAR}$) in each of the first integration capacitor ($C_{INT1}$) and the common integration capacitor ($C_{INT12}$) as residue information generated in the first integration process.

In operation 520, when a second integration control signal ($\varphi_{int2}$) is activated and a second integration process corresponding to the (n−1)-th sampling process is performed, the recycling integrator may connect the common integration capacitor ($C_{INT12}$) and a second integration capacitor ($C_{INT2}$) and may store residue information stored in the common integration capacitor ($C_{INT12}$) in the second integration capacitor ($C_{INT2}$) as residue information generated in the second integration process.

Meanwhile, in operation 530, when a SAR conversion control signal ($\varphi_{sar}$) is activated before an n-th SAR conversion process corresponding to an n-th sampling process is performed, the recycling integrator may connect in series the SAR capacitor ($C_{SAR}$) and the first integration capacitor ($C_{INT1}$) and the second integration capacitor ($C_{INT2}$), and through this, may achieve secondary noise-shaping by integrating the residue information stored in the SAR capacitor ($C_{SAR}$), the residue information stored in the first integration capacitor ($C_{INT1}$) (i.e., residue information stored through operation 510), and the residue information stored in the second integration capacitor ($C_{INT2}$), as shown in the following Equation 1.

$$V_{IN'}[n] = V_{IN}[n] + V_{INT1}[n-1] + V_{INT2}[n-1] \qquad \text{[Equation 1]}$$

Referring to a block diagram of reference numeral 540 that expresses the aforementioned Equation 1 as a higher-level expression, coefficients of $A_{CL1}$ and $A_{CL2}$ represent closed-loop gain of each integration process.

In detail, in the block diagram, as shown in the following Equation 2, each closed-loop gain for loop stability and ideal integration is set to "1" and quantization noise ($Q_n$) derived through the block diagram represents a secondary noise form.

$$A_{CL1} = C_{SAR}/C_{INT1} = 1, A_{CL2} = C_{INT12}/C_{INT2} = 1 \qquad \text{[Equation 2]}$$

$$D_{OUT} = IN + (1 - z^{-1})^2 \cdot Q_n$$

That is, the recycling integrator according to an example embodiment has a simple structure that uses a single amplifier and k integration capacitors and may reduce the system complexity and, at the same time, may easily increase loop order in a design process and design a noise-optimized comparator.

Figure 6:
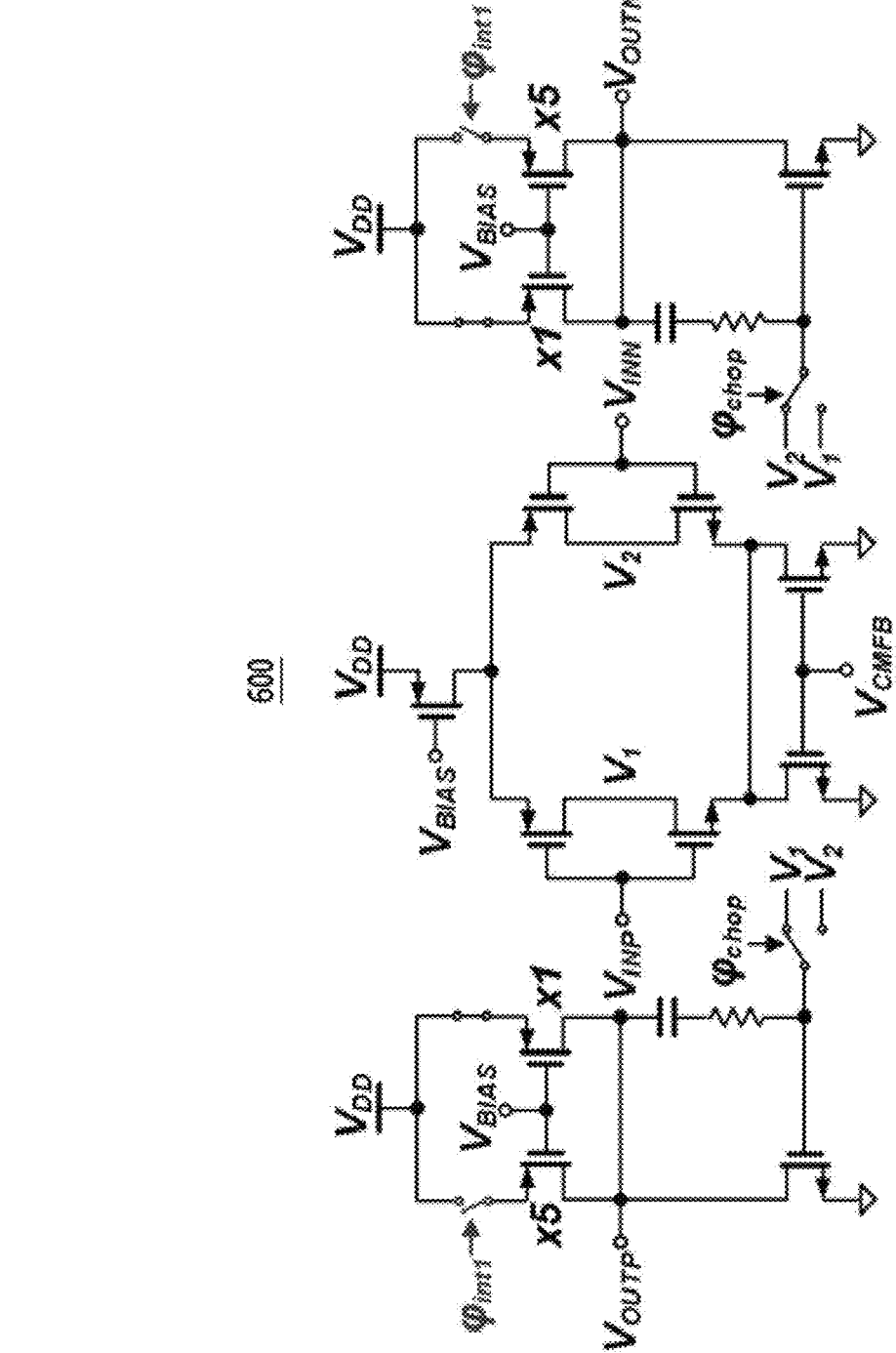
FIG. 6 illustrates in more detail an amplifier provided to a recycling integrator according to an example embodiment.
Figure 7A:
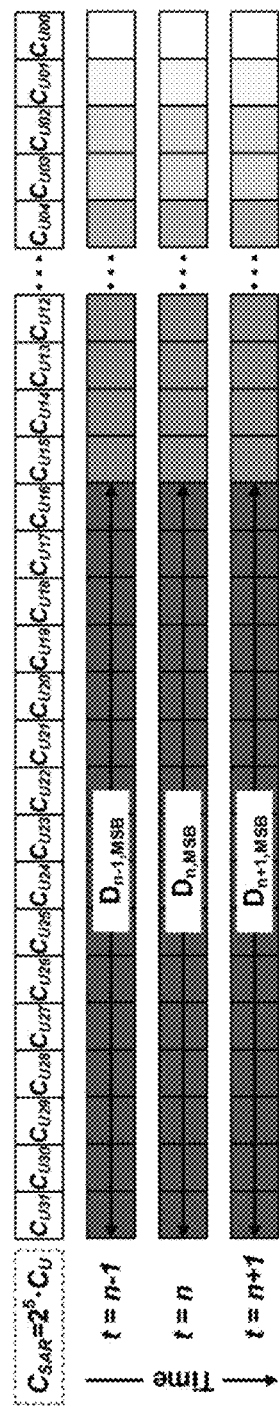
FIGS. 7A and 7D illustrate in detail an operating method of a clock-averaged (CLA) element matching unit according to an example embodiment.
Figure 7B:
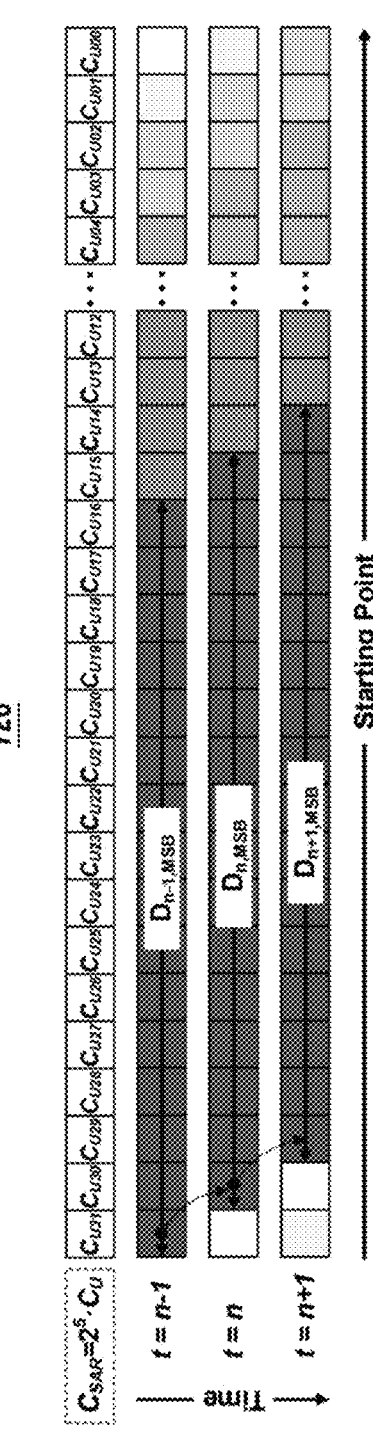
Figure 7C:
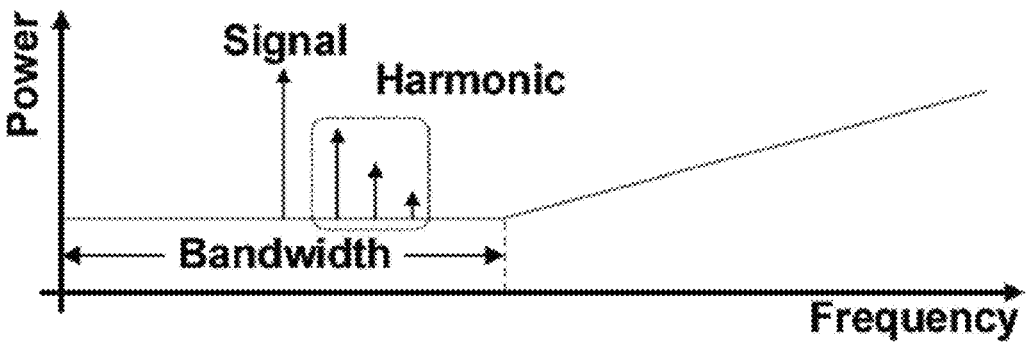
Figure 7D:
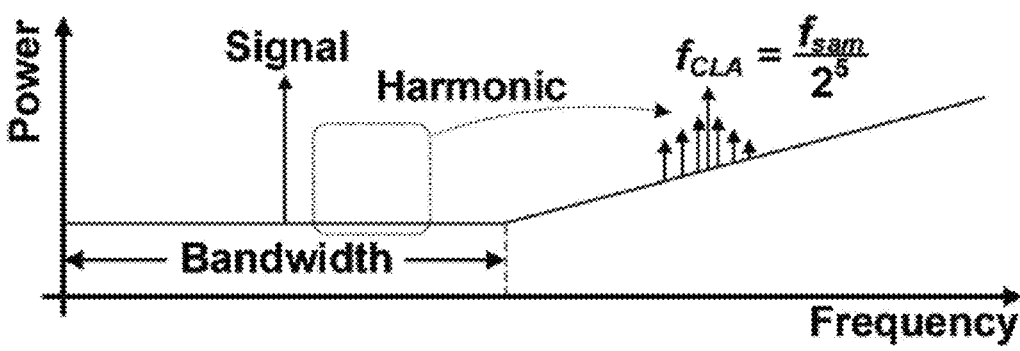

FIG. 6 illustrates in more detail an amplifier provided to a recycling integrator according to an example embodiment.

Referring to FIG. 6, the recycling integrator according to an example embodiment may implement a k-order noise-shaping characteristic using a single amplifier 600 and k integration capacitors. Here, the amplifier 600 may be implemented as an RTA in which bias current of an output stage is variable.

For example, the recycling integrator may include a first integration capacitor configured to store a residual signal according to a first integration process and a second integration capacitor configured to store a residual signal according to a second integration process.

In this case, since the second integration capacitor is smaller than the first integration capacitor, the drive strength required for each integration process may be differently set. Using the same amplifier without considering each integration process with the different drive strength may result in unnecessary power consumption.

Therefore, in the amplifier 600 provided to the recycling integrator, a plurality of switches operating in response to each of the first integration control signal ($\varphi_{int1}$) and the second integration control signal ($\varphi_{int2}$) may be formed in an output stage. In a continuous integration process, the unnecessary power consumption may be minimized by adjusting bias current of the output stage using the plurality of switches that operates in response to each of the first integration control signal ($\varphi_{int1}$) and the second integration control signal ($\varphi_{int2}$).

In more detail, the amplifier 600 includes two programmable output stages and a complementary metal-oxide semiconductor (CMOS) inverter-based input stage of doubling input transconductance for given bias current and the bias current of the output stage may be controlled in the continuous integration process such that power may be saved by about 40% compared to the existing operation.

FIGS. 7A to 7D illustrate in detail an operating method of a CLA element matching unit according to an example embodiment.

Referring to FIGS. 7A to 7D, reference numeral 710 illustrates an operation process in the case of not performing a CLA element matching process and reference numeral 720 illustrates an operation process in the case of performing the CLA element matching process.

Also, reference numeral 730 illustrates a behavioral model corresponding to reference numeral 710 and reference numeral 740 illustrates a behavioral model corresponding to reference numeral 720.

The CLA element matching unit according to an example embodiment may perform a CLA element matching process of controlling locations of 1 DAC elements corresponding to an MSB or an LSB among a plurality of DAC elements (plurality of capacitors) to rotate at each sampling period through an (n−1)-th SAR conversion process corresponding to an (n−1)-th sampling process.

According to reference numerals 710 and 730, in the case of not performing the CLA element matching process, capacitor locations from the MSB to the LSB are fixed in every conversion operation. Here, it can be seen that each unit capacitor has a slightly different size due to a process change, so harmonic tones according to a signal occur.

According to reference numerals 720 and 740, the CLA element matching unit may shift, that is, rotate a starting point of a DAC array in every conversion operation. Here, since the system uses a total of 32 DAC elements, the starting point may be rotated to an initial location after a total of 32 sampling processes.

As a result, the CLA element matching unit may generate the effect of up-modulating harmonic elements dependent on input to CLA frequency ($f_{CLA}=f_{sam}/32$) and may increase the linearity of a system within a bandwidth (increase SFDR by about 35.6 dB compared to the conventional art).

Figure 8A:
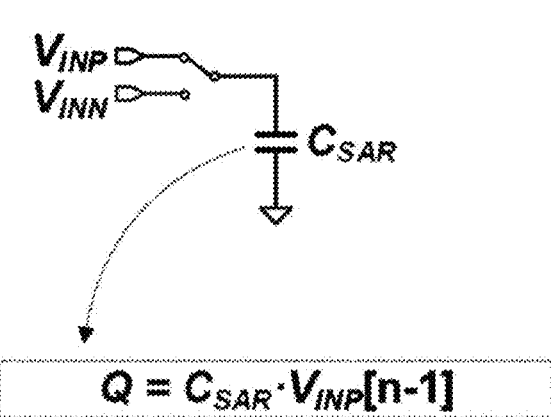
FIGS. 8A to 8C illustrate in more detail an operating method of a digital-to-analog conversion controller according to an example embodiment.
Figure 8B:
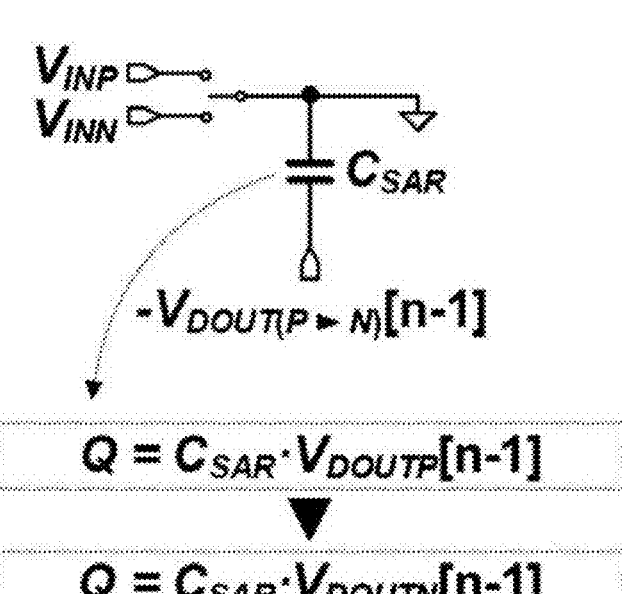
Figure 8C:
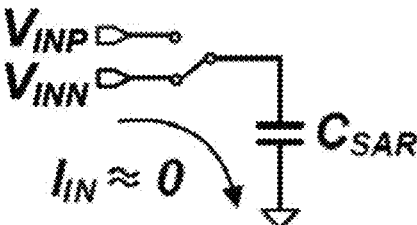
Figure 9A:
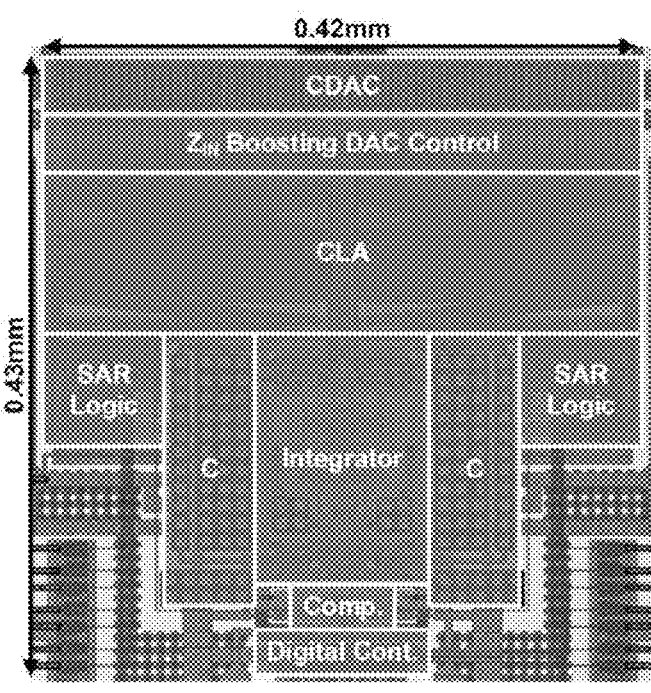
Figure 9B:
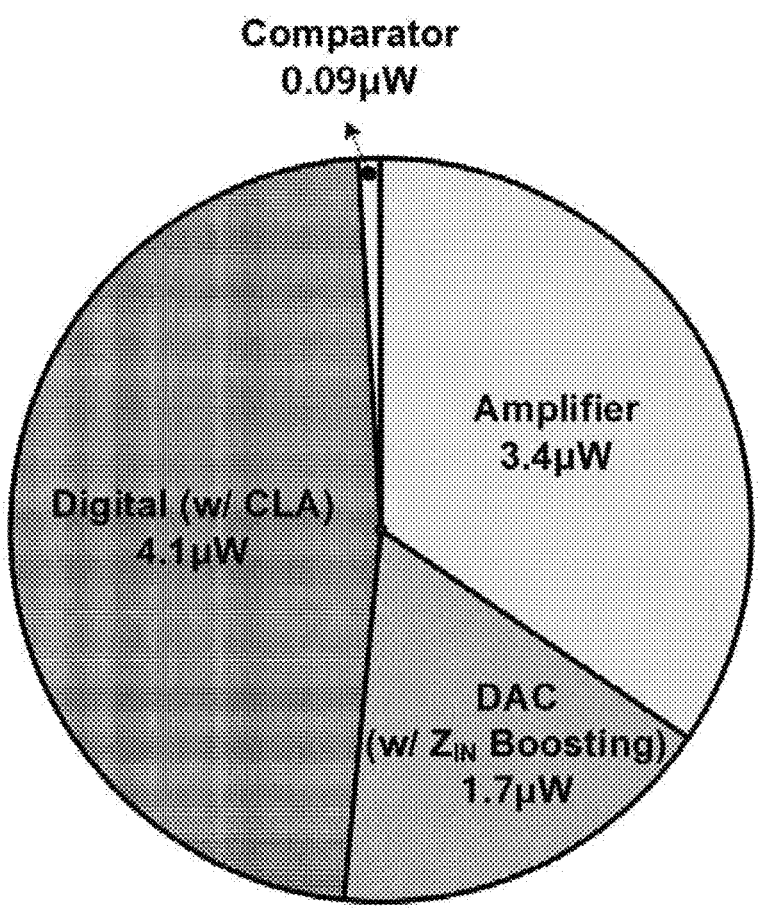
Figure 10A:
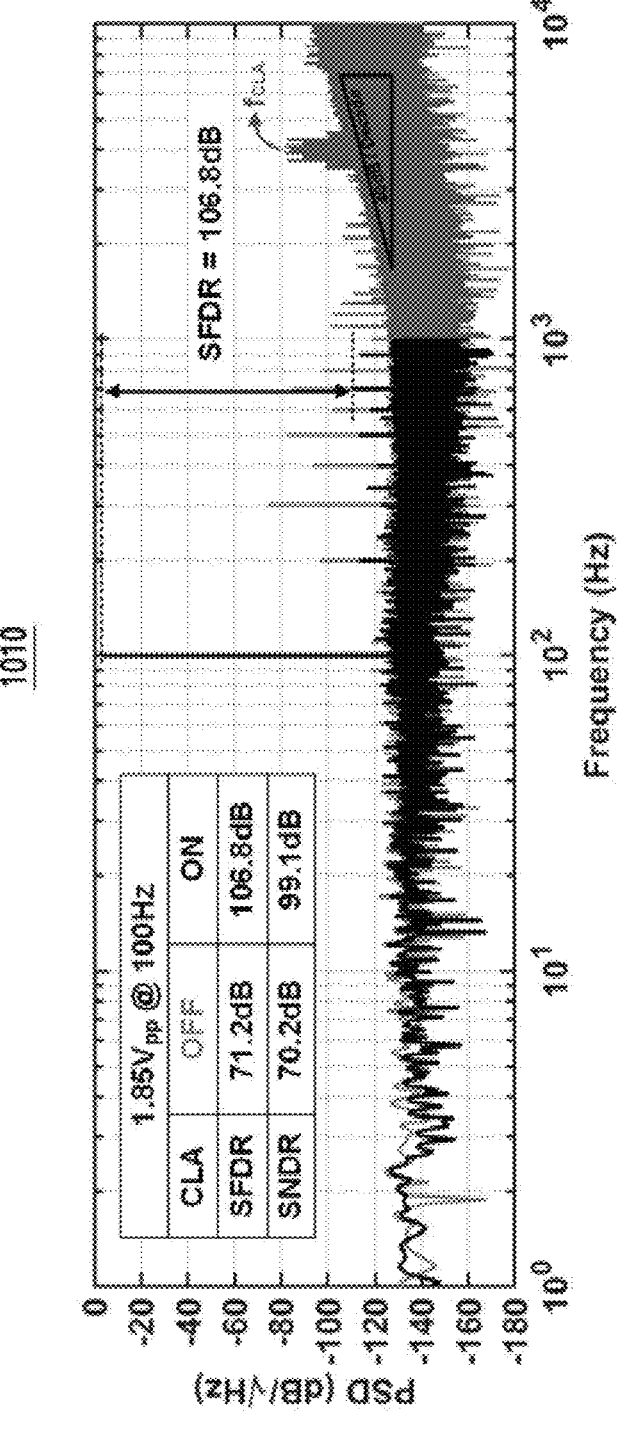
Figure 10B:
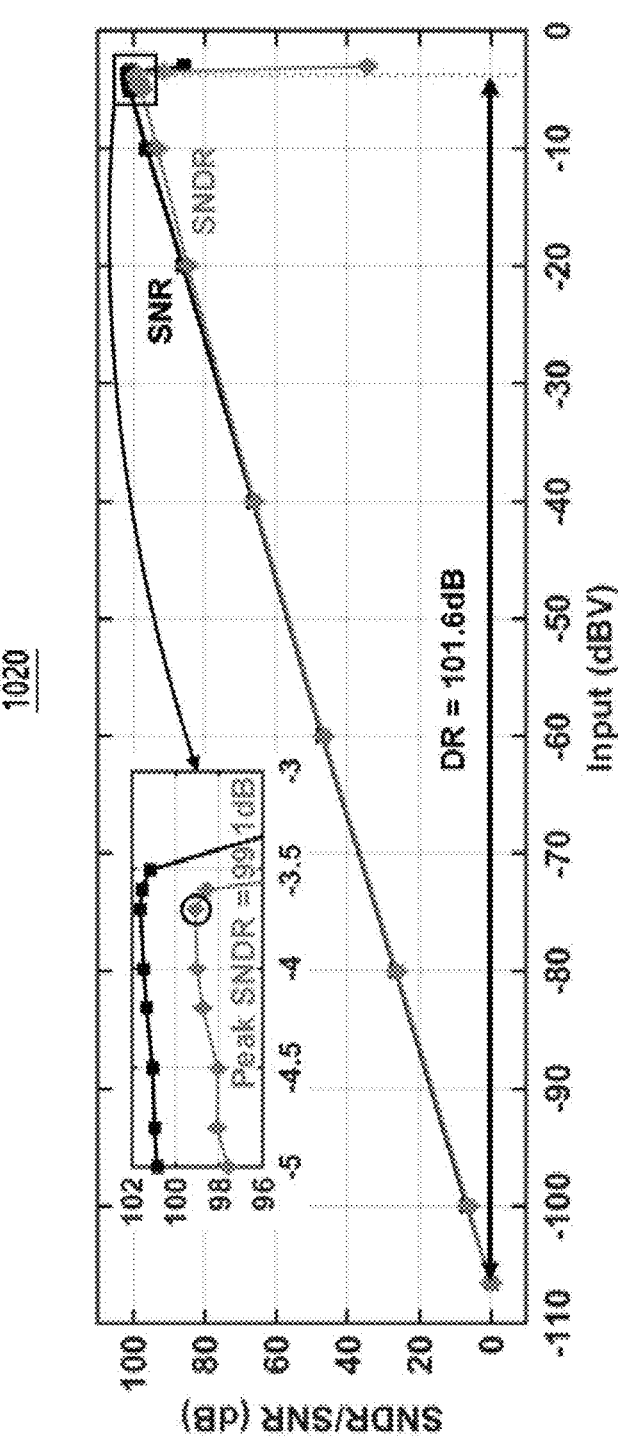
Figure 11A:
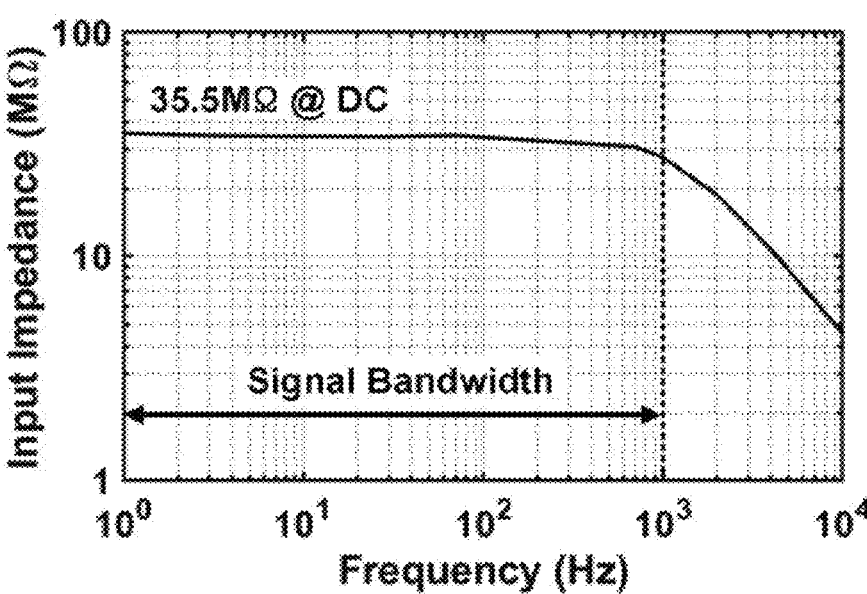
Figure 11B:
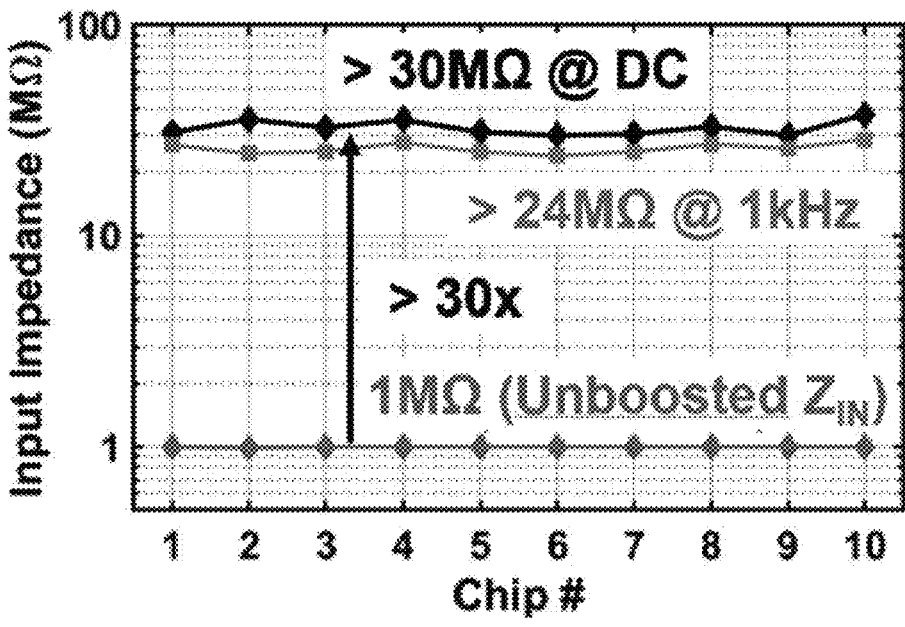
Figure 12A:
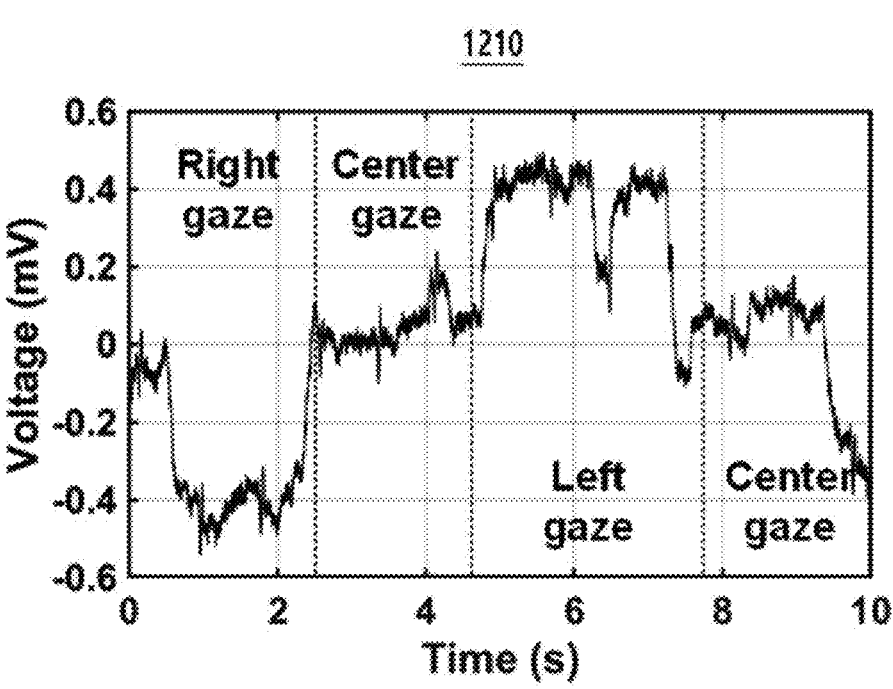
Figure 12B:
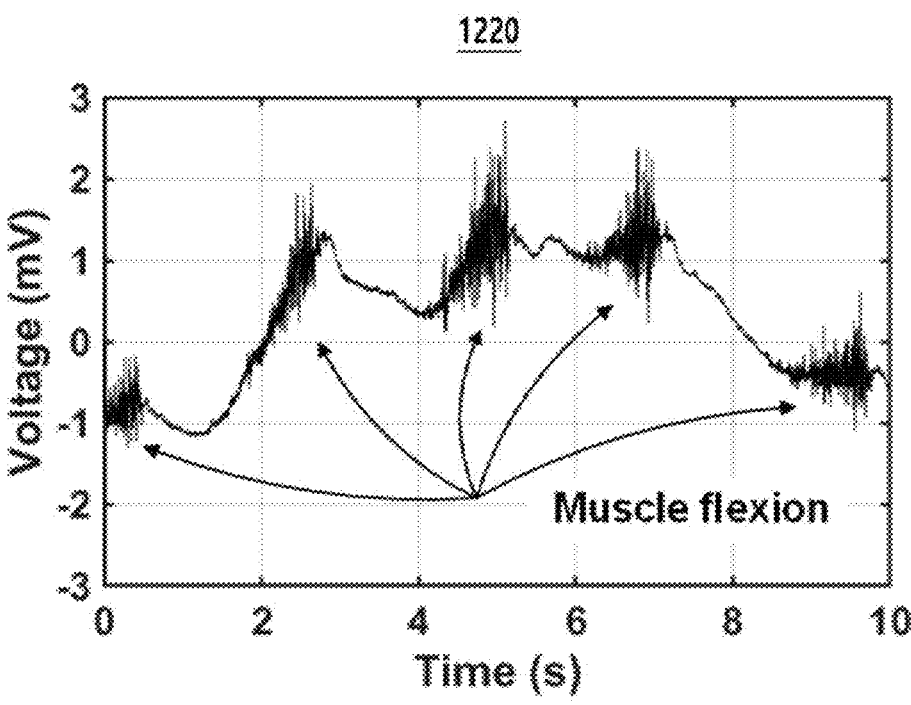
Figure 12C:
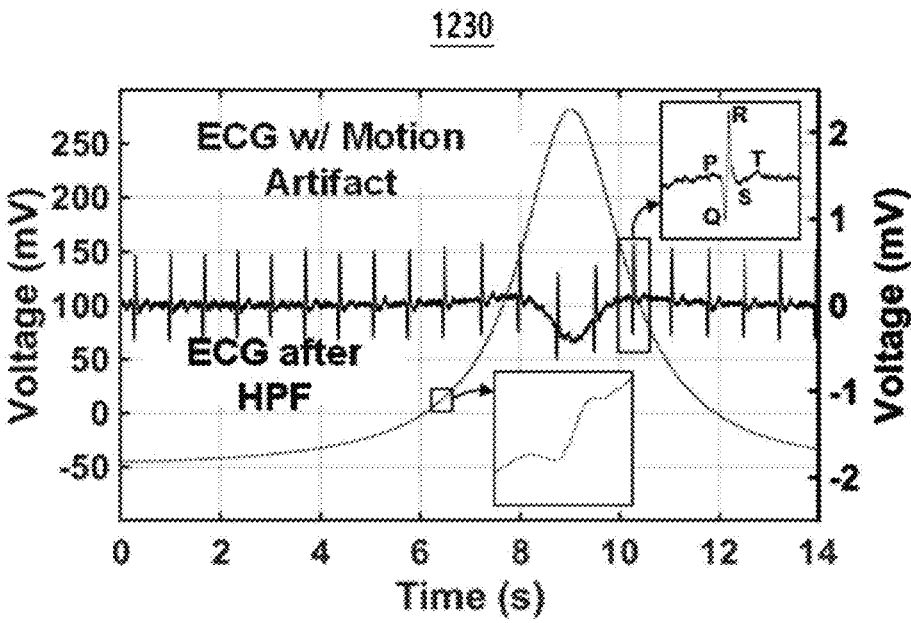

FIGS. 8A to 8C illustrate in more detail an operating method of a digital-to-analog conversion controller according to an example embodiment.

Referring to FIGS. 8A to 8C, the digital-to-analog conversion controller according to an example embodiment may restore a top-plate of a SAR capacitor ($C_{SAR}$) to an n-th input signal by changing a sign of a digital signal corresponding to an (n−1)-th input signal of a bottom-plate of the SAR capacitor ($C_{SAR}$) and then switching to a common-mode level.

In detail, in operation 810, the digital-to-analog conversion controller may store an input signal ($V_{INP}[n−1]$) in an (n−1)-th sampling process in the SAR capacitor ($C_{SAR}$).

In operation 820, the digital-to-analog conversion controller may convert the bottom-plate of the SAR capacitor ($C_{SAR}$) to a digital signal corresponding to a current input signal (i.e., (n−1)-th input signal) through a SAR conversion process, and may restore the top-plate of the SAR capacitor ($C_{SAR}$) to a subsequent input signal (i.e., n-th input signal) by changing a sign of the bottom-plate of the SAR capacitor ($C_{SAR}$) (i.e., change to opposite polarity '$-V_{DOUTN}[n−1]$') in consideration that the entire system changes a sign of an input signal at every sampling process according to system level chopping technology and then switches to a common-mode level.

In operation 830, when the input signal ($V_{INN}[n]$) is connected to the SAR capacitor ($C_{SAR}$) in an n-th sampling process, the digital-to-analog conversion controller may make an amount of current flowing in the SAR capacitor ($C_{SAR}$) become close to "0" and accordingly, amplify input impedance.

FIGS. 9A to 12C illustrate performance test results of a SAR analog-to-digital converter according to an example embodiment.

Referring to FIGS. 9A to 12C, reference numeral 910 illustrates a microscopic-captured image of a SAR analog-to-digital converter implemented as a chip, and reference numeral 920 illustrates power analysis results of the SAR analog-to-digital converter.

Also, reference numeral 1010 illustrates measurement results of power spectral density (PSD) of the SAR analog-to-digital converter and reference numeral 1020 illustrates measurement results of a signal-to-noise and distortion ratio (SNDR) and a signal-to-noise ratio (SNR) of the SAR analog-to-digital converter.

Also, reference numeral 1110 illustrates measurement results of input impedance of the SAR analog-to-digital converter, reference numeral 1120 illustrates measurement results of a multi-chip test of the SAR analog-to-digital converter, and reference numeral 1130 illustrates measurement results of input reference noise of the SAR analog-to-digital converter.

Also, reference numeral 1210 illustrates measurement results of electrooculography (EOG) derived through the SAR analog-to-digital converter, reference numeral 1220 illustrates measurements results of electromyography (EMG) derived through the SAR analog-to-digital converter, and reference numeral 1230 illustrates measurement results of electrocardiography (ECG) derived through the SAR analog-to-digital converter. In more detail, reference numeral 1230 illustrates ECG with motion artifact and ECG after high pass filter (HPF).

According to reference numeral 910 and 920, the SAR analog-to-digital converter is implemented through a 0.18

µm CMOS process, an active area occupies 0.12 mm², and the system consumes the power of 9.29 µW at 1V supply voltage.

Also, a digital logic that includes CLA consumes about 70% of the entire area and 45% of the entire power.

According to reference numeral 1010, when the input of 1.85 Vpp is applied at 1V supply voltage, the SAR analog-to-digital converter shows the SNDR of 99.1 dB and the SFDR of 106.8 dB in 1 kHz bandwidth, which represents that compared to before using CLA technology, the SNDR was improved by 28.9 dB and the SFDR was improved by 35.6 dB.

According to reference numeral 1020, results of measuring an SNDR and an SNR according to a sine input size of 100 Hz using the SAR analog-to-digital converter, it can be seen that the peak SNDR of 99.1 dB corresponds to the DR of 101.6 dB.

According to reference numeral 1110, the input impedance of the SAR analog-to-digital converter was measured as 35.5 MΩ at DC and, through this, it can be verified that the input impedance is maintained within a bandwidth.

According to reference numeral 1120, as a result of performing a multi-chip test on a total of 10 chips using the SAR analog-to-digital converter, the input impedance was measured as 30 MΩ or more at DC and 24 MΩ or more at 1 kHz in all of 10 chips, which represents that the amplification effect of about 30 times or more was achieved compared to before using input impedance amplification technology.

According to reference numerals 1210 to 1230, as a result of measuring biopotential signals, such as EOG, EMG, and ECG, using the SAR analog-to-digital converter, it can be seen that all signals are successfully read.

In particular, it can be seen that the SAR analog-to-digital converter easily reads an ECG signal without a saturation issue although motion artifact of 300 mV or more is present in the ECG signal.

Meanwhile, the performance comparison results between the SAR analog-to-digital converter (i.e., proposed) according to an example embodiment and conventional arts (Conventional 1 to Conventional 4) may be arranged in Table 1 below.

According to Table 1, when compared to conventional arts based on a CTDSM structure, an NS-SAR structure, and the like, the SAR analog-to-digital converter according to an example embodiment was analyzed to achieve the performance of 179.4 dB $FOM_{SNDR}$ and 181.9 dB $FO_{MDR}$ and to have the highest performance compared to the existing technology.

Accordingly, using the present invention, it is possible to overcome limitations of the existing high-order loop filter and to secure space margin by performing a high-order integration process by recycling a single amplifier provided to an integrator.

Also, using the present invention, it is possible to amplify input impedance by reusing information stored through sampling.

Also, using the present invention, it is possible to improve the linearity of a system by solving a mismatch problem of a SAR capacitor through an element matching process.

While the example embodiments are described with reference to specific example embodiments and drawings, it will be apparent to one of ordinary skill in the art that various changes and modifications in form and details may be made in these example embodiments from the description. For example, suitable results may be achieved if the described techniques are performed in a different order, and/or if components in a described system, architecture, device, or circuit are combined in a different manner, or replaced or supplemented by other components or their equivalents.

Therefore, other implementations, other example embodiments, and equivalents of the claims are to be construed as being included in the claims.

EXPLANATION OF SYMBOLS

200: SAR analog-to-digital converter
210: Input unit
220: Recycling integrator
230: Comparator
240: CLA element matching unit
250: Digital-to-analog conversion controller

TABLE 1

| Parameters | Conventional 1 | Conventional 2 | Conventional 3 | Conventional 4 | Proposed |
|---|---|---|---|---|---|
| Technology [nm CMOS] | 65 | 65 | 55 | 40 | 180 |
| Topology | CTAΣM + DEM ($2^{nd}$-ord.) | DPCM + DEM ($1^{st}$-ord.) | NS-SAR + MES ($1^{st}$-ord.) | NS-SAR + MES ($1^{st}$-ord.) | NS-SAR + CLA ($2^{nd}$-ord.) |
| Supply Voltage [V] | 1.2/0.8 | 0.8 | 1.2 | 1.1 | 1 |
| Power/Ch [µW] | 4.25 | 1.68 | 15.7 | 67.4 | 9.29 |
| Sampling Freq. [Hz] | 200 k | 64 k | 1M | 2M | 128 k |
| BW [Hz] | 1 k | 500 | 1 k | 10 k | 1 k |
| Inp.-Ref. Noise [$µV_{rms}$] | 3.56 | 2.63 | 5.52* | 13.36* | 4.69 |
| SNDR/ENOB [dB/bit] | 92.3/15 | 94.2/15.4 | 101/16.5 | 95.3/15.5 | 99.1/16.2 |
| DR [dB] | 92.3 | 95.1 | 101.7 | 98.5 | 101.6 |
| $FOM_{SNDR}$ [dB] | 174.7 | 178.9 | 178.9 | 177 | 179.4 |
| $FOM_{DR}$ [dB] | 174.7 | 179.8 | 179.6 | 180.2 | 181.9 |
| Peak Input [$V_{pp}$] | 0.4 | 0.46 | 1.75 | 2.2 | 1.85 |
| $Z_{IN}$ @DC/1KHz [MΩ] | 60/50 | 8/8 | 0.4*/0.4* | 0.02*/0.02* | >30/>24 |
| CMRR [dB] | 89 | 97 | — | — | >93 |
| Channel Area [mm²] | 0.075 | 0.055 | 0.072 | 0.061 | 0.12 |

What is claimed is:

1. A successive approximation register (SAR) analog-to-digital converter comprising:

an input unit including at least one SAR capacitor;

a recycling integrator connected to the input unit and including k integration capacitors configured to store respective residue information generated in an integration process performed k times, respectively, (where k denotes a positive integer of 2 or more) using a single amplifier;

a comparator connected to an output terminal of the recycling integrator; and a SAR controller connected to an output terminal of the comparator and configured to generate a digital signal corresponding to output of the comparator, wherein the input unit is configured to store an input voltage received through an (n−1)-th (where n denotes a positive integer of 2 or more) sampling process in the SAR capacitor as an (n−1)-th input signal, wherein the recycling integrator is configured to store residue information generated in a first integration process in a first integration capacitor, to store residue information generated in a second integration process in a second integration capacitor, and to connect in series the SAR capacitor, the first integration capacitor, and the second integration capacitor before an n-th SAR conversion process corresponding to an n-th sampling process is performed, and to reduce input of the comparator to one, and wherein the recycling integrator is further configured to, in the first integration process, connect the SAR capacitor to the first integration capacitor and a common integration capacitor and store the (n−1)-th input signal in each of the first integration capacitor and the common integration capacitor as residue information generated in the first integration process, and in the second integration process, connect the common integration capacitor and the second integration capacitor and store the residue information stored in the common integration capacitor in the second integration capacitor as residue information generated in the second integration process.

2. The SAR analog-to-digital converter of claim 1, further comprising:

a clock-averaged (CLA) element matching unit and a digital-to-analog conversion controller provided on a loop that connects the SAR controller and the SAR capacitor.

3. The SAR analog-to-digital converter of claim 2, wherein the digital-to-analog conversion controller is configured to convert a bottom-plate of the SAR capacitor to a digital signal corresponding to the (n−1)-th input signal through a (n−1)-th SAR conversion process corresponding to the (n−1)-th sampling process and to amplify input impedance by restoring a top-plate of the SAR capacitor to an n-th input signal based on the digital signal corresponding to the (n−1)-th input signal when performing an n-th sampling process.

4. The SAR analog-to-digital converter of claim 3, wherein the digital-to-analog conversion controller is configured to restore the top-plate of the SAR capacitor to the n-th input signal by changing a sign of the digital signal corresponding to the (n−1)-th input signal of the bottom-plate of the SAR capacitor and then switching to a common-mode level.

5. The SAR analog-to-digital converter of claim 2, wherein the CLA element matching unit is configured to perform a CLA element matching process of controlling locations of 1 (where I denotes a positive integer) DAC elements corresponding to a most significant bit (MSB) or a least significant bit (LSB) among a plurality of DAC elements to rotate at each sampling period through an (n−1)-th SAR conversion process corresponding to the (n−1)-th sampling process.

6. The SAR analog-to-digital converter of claim 1, wherein the recycling integrator further includes:

a plurality of SAR switches configured to control a connection between the SAR capacitor and the first integration capacitor and a connection between the first integration capacitor and the second integration capacitor;

a plurality of first integration switches configured to control the connection between the SAR capacitor and the first integration capacitor and the connection between the first integration capacitor and the common integration capacitor; and a plurality of second integration switches configured to control a connection between the second integration capacitor and the common integration capacitor.

7. The SAR analog-to-digital converter of claim 1, wherein the amplifier is a reconfigurable transconductance amplifier (RTA) in which bias current of an output stage is variable.

8. A successive approximation register (SAR) analog-to-digital converter comprising:

an input unit including at least one SAR capacitor;

a recycling integrator connected to the input unit and including k integration capacitors configured to store respective residue information generated in an integration process performed k times, respectively, (where k denotes a positive integer of 2 or more) using a single amplifier;

a comparator connected to an output terminal of the recycling integrator; and a SAR controller connected to an output terminal of the comparator and configured to generate a digital signal corresponding to an output of the comparator, wherein when a SAR conversion control signal is activated before an n-th SAR conversion process corresponding to an n-th sampling process is performed, the recycling integrator connects in series a SAR capacitor (CsAR), a first integration capacitor (CINT1), and a second integration capacitor (CINT2), and through the connection, the recycling integrator achieves noise-shaping by integrating residue information stored in the SAR capacitor (CsAR), residue information stored in the first integration capacitor (CINT1), and residue information stored in the second integration capacitor (CINT2), as shown in the following Equation 1.

$$V_{IN'}[n] = V_{IN}[n] + V_{INT1}[n-1] + V_{INT2}[n-1]. \qquad \text{[Equation 1]}$$

* * * * *